(12) United States Patent
Liang et al.

(10) Patent No.: US 10,779,088 B1
(45) Date of Patent: Sep. 15, 2020

(54) SOUND PRODUCING DEVICE

(71) Applicant: xMEMS Labs, Inc., Los Altos, CA (US)

(72) Inventors: Jemm Yue Liang, Sunnyvale, CA (US); Lei Chen, Hayward, CA (US)

(73) Assignee: xMEMS Labs, Inc., Santa Clara, CA (US)

( * ) Notice: Subject to any disclaimer, the term of this patent is extended or adjusted under 35 U.S.C. 154(b) by 0 days.

(21) Appl. No.: 16/817,567

(22) Filed: Mar. 12, 2020

Related U.S. Application Data

(60) Provisional application No. 62/871,157, filed on Jul. 7, 2019.

(51) Int. Cl.
| | |
|---|---|
| *H04R 9/06* | (2006.01) |
| *H04R 9/04* | (2006.01) |
| *H03K 5/156* | (2006.01) |
| *H03K 5/13* | (2014.01) |

(52) U.S. Cl.
CPC ............ *H04R 9/042* (2013.01); *H03K 5/13* (2013.01); *H03K 5/1565* (2013.01); *H04R 9/06* (2013.01)

(58) Field of Classification Search
CPC . G10K 9/02; H04R 1/02; H04R 17/00; H04R 9/042
USPC .................. 381/55, 119, 182, 400; 181/142
See application file for complete search history.

(56) References Cited

U.S. PATENT DOCUMENTS

| | | |
|---|---|---|
| 6,163,613 A | 12/2000 | Cowans |
| 8,818,007 B2 | 8/2014 | Robert |
| 2002/0009202 A1 | 1/2002 | Sheplak |
| 2012/0018244 A1 | 1/2012 | Robert |
| 2013/0044904 A1* | 2/2013 | Margalit ............... H04R 31/00 381/182 |
| 2019/0313189 A1 | 10/2019 | Liang |

* cited by examiner

*Primary Examiner* — Md S Elahee
(74) *Attorney, Agent, or Firm* — Winston Hsu

(57) ABSTRACT

A sound producing device includes at least one air pulse generating element. Each of the at least one air pulse generating element includes a membrane, a first air chamber and at least one opening, wherein a chamber pressure exists in the first air chamber. The membrane is actuated to change the chamber pressure of the first air chamber to generate a plurality of air pulses, the air pulses are propagated through the at least one opening, the air pulses produce a non-zero offset in terms of sound pressure level, and the non-zero offset is a deviation from a pressure value of an ambient pressure outside the sound producing device. Each pulse cycle has a pulse-generating time segment and a pulse-isolating time segment, the driving signal during the pulse-generating time segment is different from the driving signal during the pulse-isolating time segment.

23 Claims, 16 Drawing Sheets

US 10,779,088 B1

SOUND PRODUCING DEVICE

CROSS REFERENCE TO RELATED APPLICATIONS

This application claims the benefit of U.S. provisional application No. 62/871,157, filed on Jul. 7, 2019, which is incorporated herein by reference.

BACKGROUND OF THE INVENTION

1. Field of the Invention

The present invention relates to a sound producing device, and more particularly, to a sound producing device capable of producing high fidelity sound.

2. Description of the Prior Art

A speaker driver is always the most difficult challenge for high-fidelity sound reproduction in the speaker industry. The physics of sound signal propagation teaches that, within the human audible frequency range, the sound pressures generated by accelerating a membrane of a conventional speaker drive may be expressed as $P \propto Sm \cdot A$ (Eq. 1), where Sm is the membrane surface area and A is the acceleration of the membrane. Namely, the sound pressure P is proportional to the product of the membrane surface area Sm and the acceleration of the membrane A. In addition, the membrane displacement Dm may be expressed as $Dm \propto \frac{1}{2} \cdot A \cdot T^2 \propto 1/f^2$ (Eq. 2), where T and f are the period and the frequency of the sound signal respectively. The air volume movement $V_{A,CV}$ caused by the conventional speaker driver may then be expressed as $V_{A,CV} \propto Sm \cdot Dm$. For a specific speaker driver, where the membrane surface area is constant, for a certain sound pressure P, the air movement $V_{A,CV}$ is proportional to $1/f^2$, i.e., $V_{A,CV} \propto 1/f^2$ (Eq. 3).

For example, in a conventional electrodynamics speaker driver, where its coils and magnets are used to produce membrane driving force, the sound of 18 kHz is produced by its membrane with a certain surface area vibrating at 18 kHz, while the sound of 30 Hz is also produced by the membrane vibrating at 30 Hz. As a result, for a certain sound pressure P, the ratio of net air volumes moved by the membrane between these two frequencies (i.e., 30 Hz and 18 kHz) will be 360,000. In other words, in order to produce the same sound pressure level (SPL) at 30 Hz, the speaker driver will need to move 360,000 times the amount of air required for producing the same sound pressure level at 18 kHz.

To cover a full range of human audible frequencies, e.g., from 20 Hz to 20 kHz, tweeter(s), mid-range driver(s) and woofer(s) have to be incorporated within a conventional speaker. All these additional components would occupy large space of the conventional speaker and will also raise its production cost. Hence, one of the design challenges for the conventional speaker is the impossibility to use a single driver to cover the full range of human audible frequency.

Another design challenge for producing high-fidelity sound by the conventional speaker is its enclosure. The speaker enclosure is often used to contain the back-radiating wave of the produced sound to avoid cancellation of the front radiating wave in certain frequencies where the corresponding wavelengths of the sound are significantly larger than the speaker dimensions. The speaker enclosure can also be used to help improve, or reshape, the low-frequency response. Therefore, with properly selected speaker driver and enclosure parameters, the combined enclosure-driver resonance peaking can be leveraged to boost the output of sound around the resonance frequency and therefore improve the performance of resulting speaker.

However, when the speaker enclosure's internal volume is not sufficiently large, the ratio of the air volume movement to the volume of the enclosure rises and the pressure fluctuation inside the enclosure also rises, which causes nonlinearity or distortion of membrane movement near the min-max peaks of its movement range. To avoid these problems, the conventional speaker enclosures are expected to contain sufficiently large volumes. For most high-fidelity speakers, the internal enclosure volumes are therefore generally vastly larger than the physical volumes of their speaker drivers.

Recently, micro-speakers are expected to be contained within devices such as smartphones, tablet notebooks, smartwatches, smartglasses, etc. In any of such compact devices, the volume of speaker is usually made extremely small because of the size constraint of its host devices. But, if the conventional speaker has a reduced size, the quality/fidelity of the sound produced by the conventional speaker is drastically degraded because of the above issues.

Therefore, how to provide a sound producing device to overcome the two design challenges faced by conventional speakers as stated above is an important objective in the field.

SUMMARY OF THE INVENTION

It is therefore a primary objective of the present invention to provide a sound producing device capable of producing high fidelity sound.

An embodiment of the present invention provides a sound producing device including at least one air pulse generating element. Each of the at least one air pulse generating element includes a membrane, a first air chamber and at least one opening, wherein a chamber pressure exists in the first air chamber. The membrane is actuated to change the chamber pressure of the first air chamber to generate a plurality of air pulses, the air pulses are propagated through the at least one opening, the air pulses produce a non-zero offset in terms of sound pressure level, and the non-zero offset is a deviation from a pressure value of an ambient pressure outside the sound producing device. Each of the air pulses has a pulse cycle, each of the pulse cycles has a pulse-generating time segment and a pulse-isolating time segment in sequence, a driving signal is applied to actuating the membrane in one of the pulse cycles, and the driving signal during the pulse-generating time segment is different from the driving signal during the pulse-isolating time segment.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
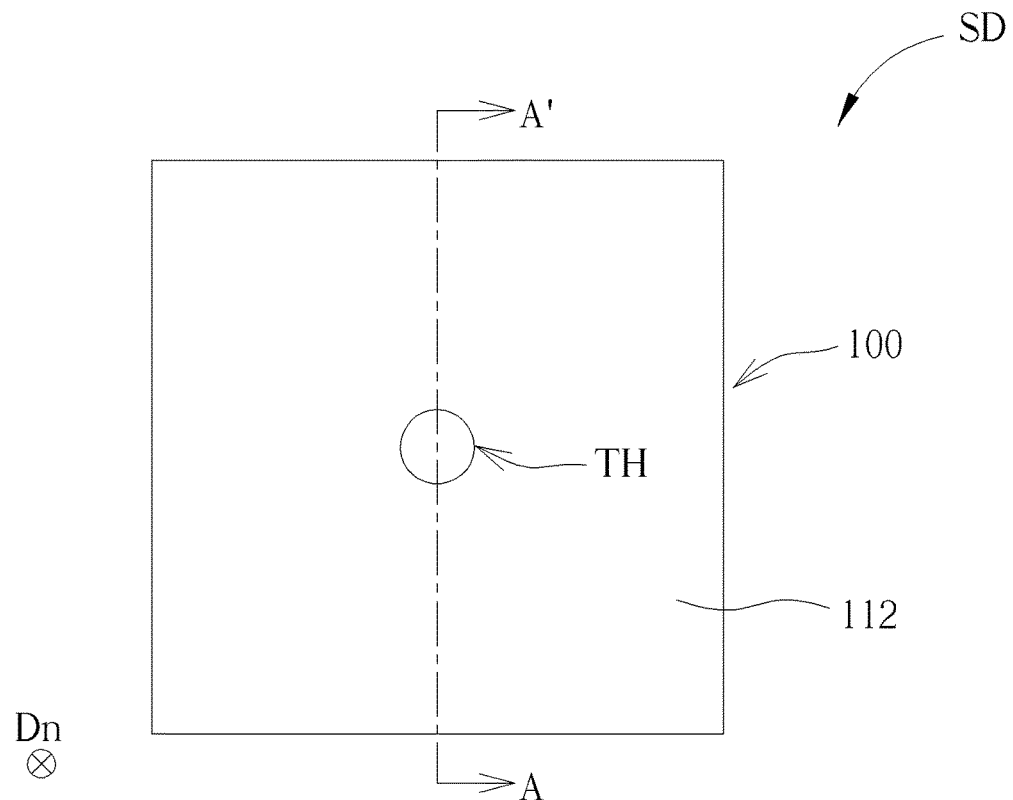
FIG. 1 is a schematic diagram of a top view illustrating an air pulse generating element of a sound producing device according to a first embodiment of the present invention.

To provide a better understanding of the present invention to those skilled in the art, preferred embodiments and typical material or range parameters for key components will be detailed in the follow description. These preferred embodiments of the present invention are illustrated in the accompanying drawings with numbered elements to elaborate on the contents and effects to be achieved. It should be noted that the drawings are simplified schematics, and the material and parameter ranges of key components are illustrative based on the present day technology, and therefore show only the components and combinations associated with the present invention, so as to provide a clearer description for the basic structure, implementing or operation method of the present invention. The components would be more complex in reality and the ranges of parameters or material used may evolve as technology progresses in the future. In addition, for ease of explanation, the components shown in the drawings may not represent their actual number, shape, and dimensions; details may be adjusted according to design requirements.

In the following description and in the claims, the terms "include", "comprise" and "have" are used in an open-ended fashion, and thus should be interpreted to mean "include, but not limited to . . . ". Thus, when the terms "include", "comprise" and/or "have" are used in the description of the present invention, the corresponding features, areas, steps, operations and/or components would be pointed to existence, but not limited to the existence of one or a plurality of the corresponding features, areas, steps, operations and/or components.

Although terms such as first, second, third, etc., may be used to describe diverse constituent elements, such constituent elements are not limited by the terms. The terms are used only to discriminate a constituent element from other constituent elements in the specification, and the terms do not relate to the sequence of the manufacture if the specification do not describe. The claims may not use the same terms, but instead may use the terms first, second, third, etc. with respect to the order in which an element is claimed. Accordingly, in the following description, a first constituent element may be a second constituent element in a claim.

It should be noted that the technical features in different embodiments described in the following can be replaced, recombined, or mixed with one another to constitute another embodiment without departing from the spirit of the present invention.

Figure 15:
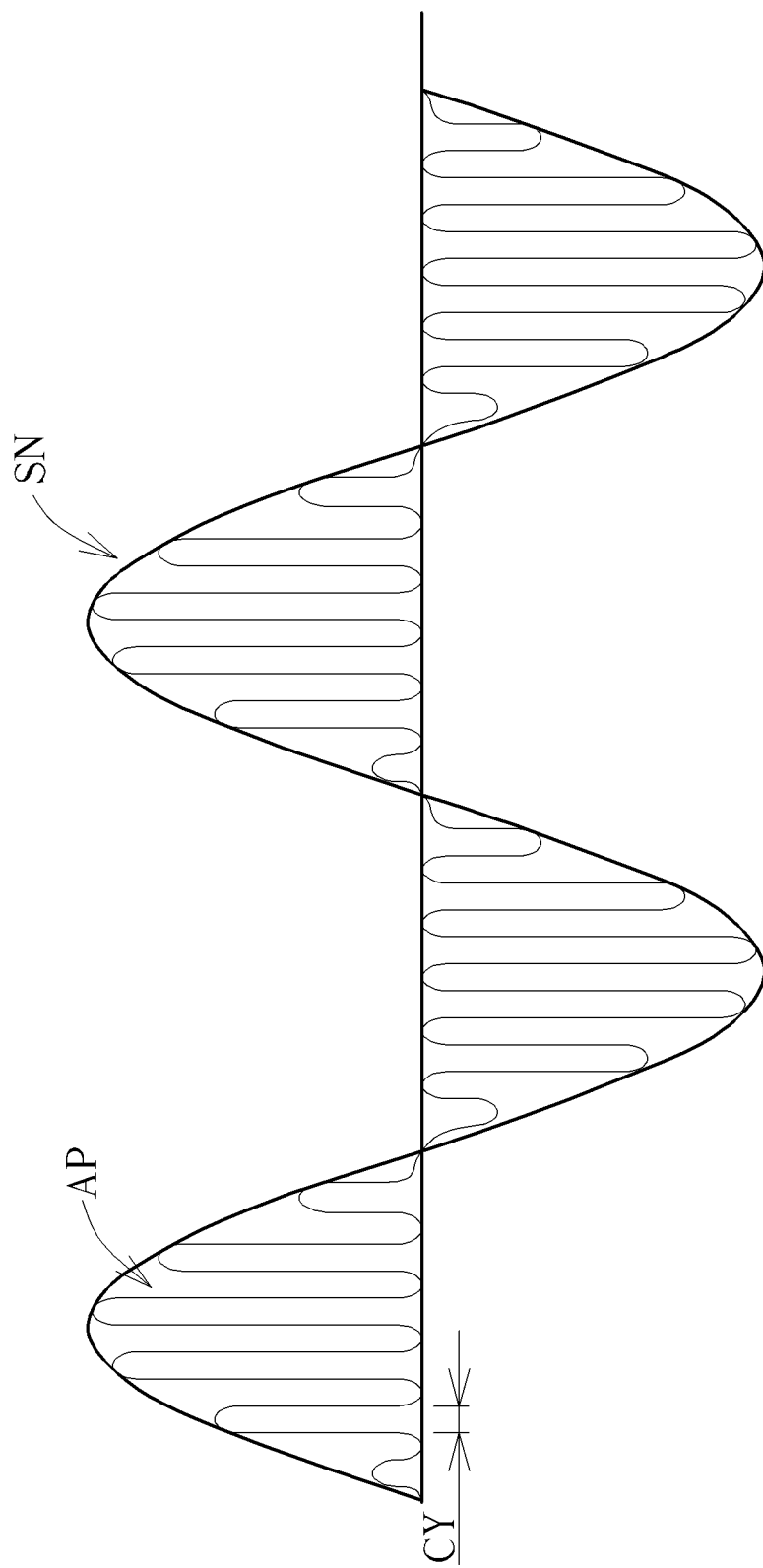
FIG. 15 is a schematic diagram illustrating sound pressure levels of air pulses generated by a sound producing device and an acoustic wave according to an embodiment of the present invention.

Instead of producing a sound at the frequency of sound, i.e., generating a sound signal complying with the zero-mean-flow assumption of classic acoustic wave theorems, as the conventional sound producing devices would have done, the sound producing device of the present invention generates a series of air pulses at a pulse rate (as shown in FIG. 15), where the pulse rate is higher than a maximum human audible frequency. The terms "pulse" and "air pulse" are used interchangeably in the following description and in claims, and should be interpreted to mean "an non-periodical pulsating variation in air pressure, relative to the ambient air pressure, caused by the sound producing device within a pulse cycle" i.e., each air pulse corresponds to a pulse cycle, where the period of the pulse cycle equals the inverse/reciprocal of the pulse rate. In other words, the air pulse is in terms of a sound pressure level (SPL), and a net SPL of the air pulse over the pulse cycle is not zero. In an embodiment, the pulse rate may be an ultrasonic rate, e.g., 72 kHz or 96 kHz, significantly higher than twice of the maximum human audible frequency, which is generally considered to be 20 kHz. This pulse rate is determined based on Nyquist law, which states, in order to avoid frequency spectral aliasing to be audible, the pulse rate needs to be at least higher than the sum of the maximum human audible frequency, 20 kHz, and the maximum frequency of the sound signal to be produced. The series/plurality of air pulses generated by the sound producing device may be referred as an ultrasonic pulse array (UPA).

Figure 2:
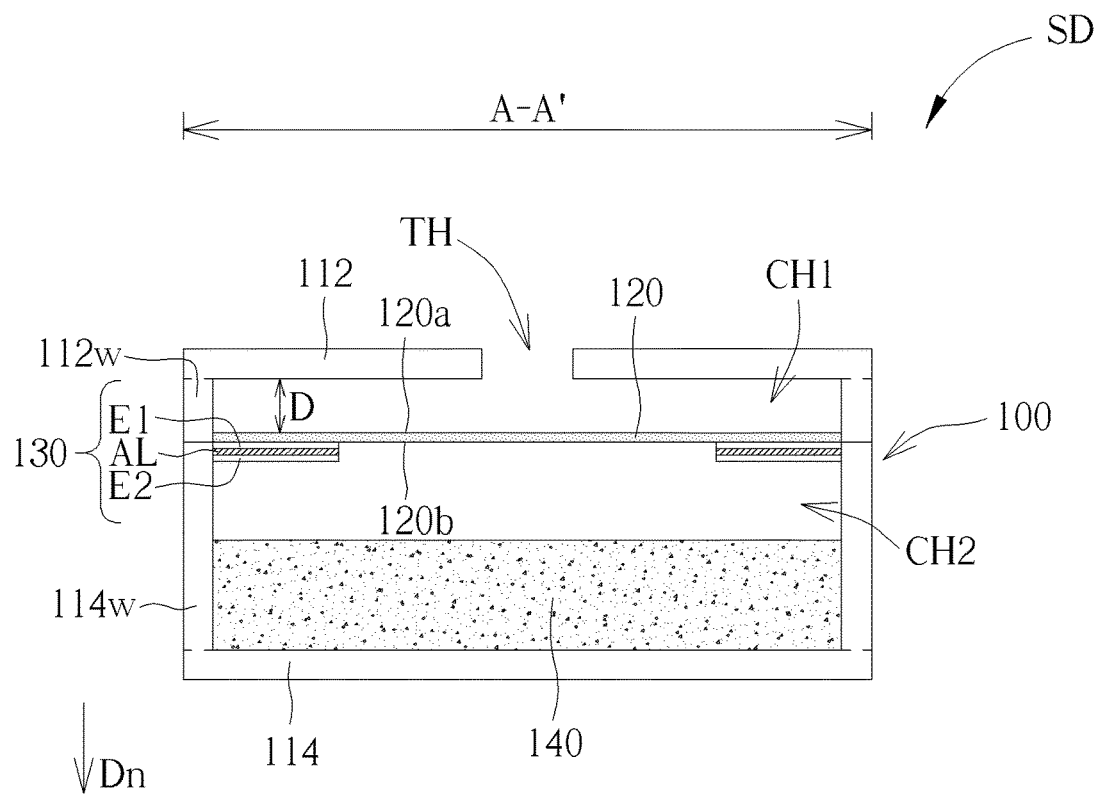
FIG. 2 is a schematic diagram of a cross sectional view taken along a cross-sectional line A-A' in FIG. 1.

Referring to FIG. 1 and FIG. 2, FIG. 1 is a schematic diagram of a top view illustrating a sound producing device, or one element out of an array of element within a sound producing device, according to a first embodiment of the present invention, and FIG. 2 is a schematic diagram of a cross sectional view taken along a cross-sectional line A-A' in FIG. 1. As shown in FIG. 1, the sound producing device SD includes at least one air pulse generating element 100, wherein the air pulse generating element 100 is configured to generate the air pulses, and each of the air pulses is in response to a corresponding driving signal based on at least one sampled value of an input signal. Note that the sampled value of the input signal represents an instantaneous value of the input signal sampled at a sampling time instant. In FIG. 1, the sound producing device SD only includes one air pulse generating element 100, but the present invention is not limited thereto. The air pulse generating element 100 includes a first faceplate 112, a membrane 120, a first air chamber CH1 and an actuator 130. Optionally, in FIG. 1 and FIG. 2, the air pulse generating element 100 may further include a second faceplate 114 and a second air chamber CH2. These components in the air pulse generating element 100 will be discussed later. In some embodiments, based on requirement(s), the air pulse generating element 100 may further include any other suitable component.

The first faceplate 112 and the second faceplate 114 are disposed oppositely based on a direction Dn. The membrane 120, the actuator 130, the first air chamber CH1 and the second air chamber CH2 are disposed between the first faceplate 112 and the second faceplate 114. Each of the first faceplate 112 and the second faceplate 114 may include any suitable material to be a rigid faceplate, and the material of the first faceplate 112 may be the same as or different from the material of the second faceplate 114. Note that the first faceplate 112 and the second faceplate 114 are immobilizing when the sound producing device SD is operated to generate the air pulses.

In FIG. 2, the membrane 120 is disposed between the first faceplate 112 and the second faceplate 114, where a first surface 120a of the membrane 120 substantially faces the first faceplate 112, and a second surface 120b of the membrane 120 substantially faces the optional second faceplate 114, if present. The membrane 120 is configured to be actuated to generate air pulses. In some embodiments, the membrane 120 may be included of single crystal silicon, poly-crystalline silicon, any other suitable compound or any combination thereof. In some embodiments, the membrane 120 may be formed by at least one semiconductor process. The length of the membrane 120 may be 300~1500 μm. In some embodiments, the membrane 120 may be at least portion of a micro electro mechanical system (MEMS). The distance D between the membrane 120 and the first faceplate 112 may be between 20~200 μm.

As shown in FIG. 2, the first air chamber CH1 is formed between the first surface 120a of the membrane 120, the sidewall 112w and the first faceplate 112, and the optional second air chamber CH2, when present, is formed between the second surface 120b of the membrane 120, the sidewall 114w and the second faceplate 114. In addition, the volume (i.e., the chamber volume) of the first air chamber CH1 is generally much smaller than the volume of the second air chamber CH2. The second faceplate 114 and the second sidewall 114w may form a back enclosure of the air pulse generating element 100. Note that the phrase "chamber pressure" in the following description and claims shall refer to "air pressure existing in the first air chamber CH1" and the phrase "pressure difference" shall refer to "the difference obtained by subtracting air pressure inside the first air chamber CH1 by air pressure in the ambient surrounding the sound producing device SD 100".

In FIG. 2, the actuator 130 is disposed on the membrane 120, and the actuator 130 causes the membrane 120 to move to a position according to the actuating voltage applied to actuator 130, such that an air pulse is generated during each pulse cycle. That is to say, the actuator 130 is capable of actuating the membrane 120 to generate the air pulses. More specifically, the membrane 120 may be actuated to move along a direction parallel to the direction Dn in FIG. 2, where the position of membrane 120 is controlled by a driving voltage applied to the actuator 130. The actuator 130 may include an actuation layer made of piezoelectric material or nanoscopic-electrostatic-drive (NED) structure, so as to be a piezoelectric actuator or a NED actuator. Specifically, in some embodiments, such as shown in FIG. 2, the actuator 130 includes a piezoelectric actuator, the piezoelectric actuator contains two electrodes E1, E2 and a piezoelectric material layer AL disposed between the electrodes E1, E2, wherein the piezoelectric material layer AL controls the displacement of the membrane 120 based on the driving voltage applied across electrodes E1 and E2. In other words, the position of the membrane 120 is controlled by the applied voltage across the electrodes E1, E2.

In particular, after driving signal (driving voltage) is applied to the actuator 130, the membrane 120 moves according to the changes of the driving signal. As a result of the movement of the membrane 120, the chamber volume inside the first air chamber CH1 changes, and such volume change of the chamber volume cause the air pressure within the first air chamber CH1 to change accordingly. Reference to FIG. 2, the pressure change (ΔP) within the first air chamber CH1 can be expressed as $$\Delta P \propto -\frac{\Delta V}{V} \propto -\frac{\Delta D}{D} \propto -\frac{\Delta U_z}{D}, \tag{Eq. 4}$$

where V is the chamber volume of the first air chamber CH1, D is the average spacing between the membrane 120 and first faceplate 112 (as shown in FIG. 2), ΔUz is the average membrane movement of the membrane 120 along direction Dn. The effectiveness of chamber compression pressure generation can be appreciated in the following example: let D≈100 μm and ΔUz≈1 μm, then ΔP≈0.01 atm. Given 1 Pa=93.78 dB SPL, 0.01 atm=1013.25 Pa=154 dB SPL. In other words, by utilizing chamber compression effect, merely 1 μm displacement of the membrane 120 can generate up to 154 dB of sound pressure within the first air chamber CH1.

In order to utilize the pressure change ΔP generated by chamber compression effect described above, either the membrane 120 or the first faceplate 112 has at least one opening connected between the chamber volume within the first air chamber CH1 and the ambient surrounding sound producing device SD (that is to say, one of the membrane 120 or the first faceplate 112 has at least one opening). In this embodiment, the opening may be a through hole TH. Namely, either the membrane 120 or the first faceplate 112 may have at least one through hole TH. In FIG. 2, the first faceplate 112 has one single through hole TH, but not limited thereto. Note that, in the description below, unless specified otherwise, the phrase "through-hole TH" shall refer to the entire collection of one or more through holes TH connecting the chamber volume within the first air chamber CH1 to its surrounding ambient.

When pressure change ($\Delta P$ of Eq. 4) produced by chamber volume compression or expansion is non-zero, a pressure gradient will be formed through the opening (i.e., through-hole TH), and acoustic wave (i.e., the air pulses) will propagate as a result. In addition, since acoustic wave is propagated by collisions among air molecules, the transmission direction will be roughly parallel to the walls of the through-hole TH, normal to the plane of the opening surface (s) of the through-hole TH, and the transmission speed will be constant, the speed of sound. Thus, in one case, the opening may face the listener to make him/her hear the acoustic wave, but not limited thereto. In another case, the sound producing device SD may include a guiding conduit disposed on and corresponding to the opening, such that the air pulses may be turned to other direction after generated by the air pulse generating element 100. For example, the guiding conduit may turn the air pulses to a direction perpendicular to the direction Dn, but not limited thereto.

Figure 6:
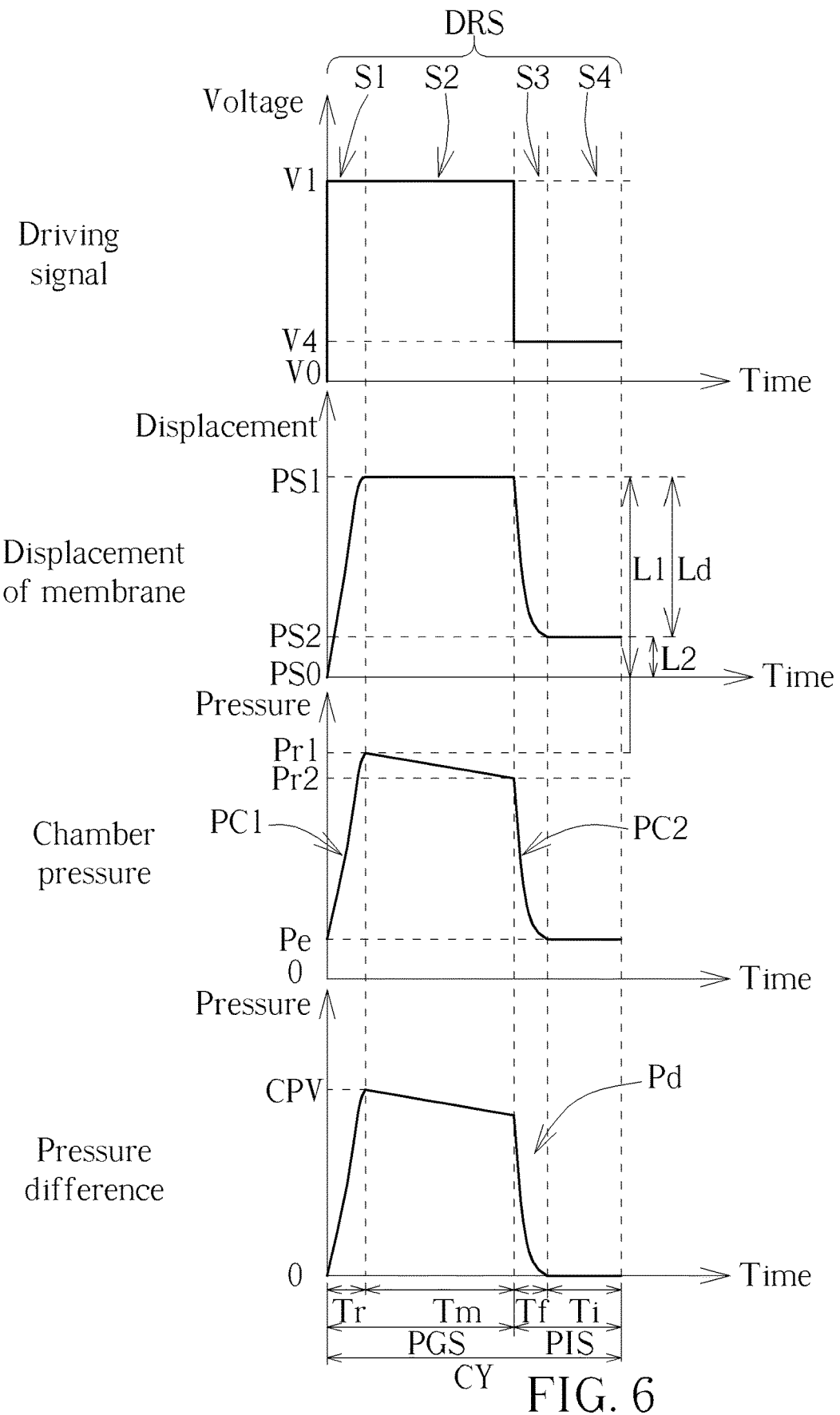
FIG. 6 is a schematic diagram illustrating a driving signal, a displacement of a membrane, a chamber pressure and a pressure difference between the chamber pressure and the ambient pressure according to an embodiment of the present invention.

The amount of acoustic energy transmitted via the through-hole TH during each pulse cycle can be expressed as $$\int_{t=t_0}^{CY} \Delta P_t \cdot S \cdot dt, \quad \text{(Eq. 5)}$$

where $\Delta P_t$ (per Eq. 5) is the instantaneous pressure difference across the through-hole TH at time t, S is the total surface area of the through-hole TH, and $t_0$, CY is the start and the period of one pulse cycle respectively (per FIG. 6). In order to maximize the acoustic energy output from the air pulse generating element 100, it is desirable to maximize the product of $\Delta P_t \cdot S$, which means it's desirable to have both high pressure change $\Delta P$ (per Eq. 4) and the large surface area S of the through-hole TH. However, regarding each through hole TH, larger surface area of the through hole TH leads to more air escaping from the first air chamber CH1, and vice versa, such that the larger surface area of the through hole TH causes the pressure change $\Delta P$ to drop more rapidly and, as such, may lower the net output SPL of the air pulse generating element 100 when integrated over the pulse cycle (per Eq. 5). It is therefore desirable to provide a construct where the effective surface area for the acoustic propagation (via collisions among air molecules) can be significantly larger than the effective surface area for the airflow (via kinetic movement of air mass).

Figure 3:
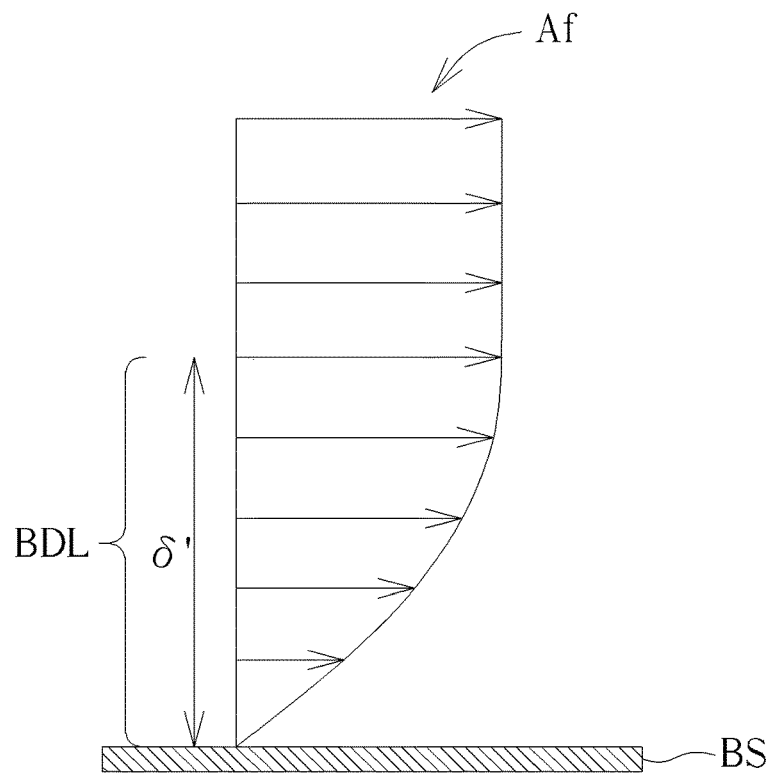
FIG. 3 is a schematic diagram illustrating velocities of airflow and a boundary layer thickness.

Refer to chart in FIG. 3 where the relationship between airflow (Af) velocity and boundary layer thickness $\delta'$ is illustrated. Airflow boundary layer effect can be summarized as: when airflow Af flows within the boundary layer BDL of a no-slip solid bounding surface BS, the velocity of the airflow Af decreases from its free stream velocity outside of the boundary layer BDL to 0 at the surface of the bounding surface BS, and a boundary layer thickness $\delta'$ of the bounding surface BS is determined. By taking advantage of the boundary layer effect described above, in the through hole TH, the effective surface area for the airflow can be made to appear smaller to decrease the air flowing through the through hole TH and therefore slow down the rate of air escaping the first air chamber CH1 which reduces the drop of $\Delta P_t \cdot S$ in Eq. 5.

Figure 4:
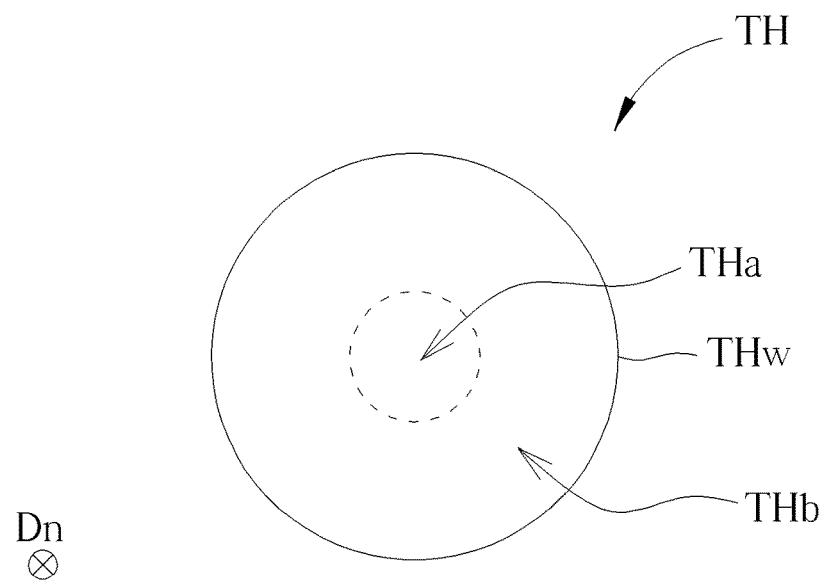
FIG. 4 is a schematic diagram illustrating a through hole according to an embodiment of the present invention.

FIG. 4 is a schematic diagram illustrating the top-view of one through hole according to an embodiment of the present invention. As an example, consider a case where the diameter of the through-hole TH equals 2× the thickness $\delta$ of the boundary layer corresponding to the surface condition and the curvature of a wall THw of the through hole TH. The velocity of the airflow flowing within the boundary layer of the through hole TH can be subdivided into two parts as shown in FIG. 4: a first subdivision THa at the center of through hole TH, and a second subdivision THb extending from the border of the first subdivision THa to the wall THw of the through hole TH, wherein the radial spacing between the border of the first subdivision THa and the wall THw equals $\delta/2$, or half the boundary layer thickness $\delta$, such that the velocity of the airflow within the second subdivision THb rises from 0 at the surface of the wall THw to approximately 50% of the free stream velocity at the border of the first subdivision THa and continue to rise toward free stream velocity of the airflow toward the center of through hole TH. For a through hole TH of diameter 2.6, the average airflow velocity of the second subdivision THb will be approximately $$\frac{1 \cdot 0 + \frac{1}{2} \cdot \frac{1}{2}}{2} = \frac{1}{8}$$

of the free stream airflow velocity. As a result, the average velocity of airflow over the entire surface of the through hole TH can be approximated as $$AF_{THb} + AF_{THa} = \frac{3}{4} \cdot \frac{1}{8} + \frac{1}{4} \cdot \frac{\frac{1}{2}+1}{2} \approx 0.28$$

of free stream airflow velocity. In other words, regarding the through hole TH, the effective surface area for the airflow is reduced by ~70% due to the boundary layer effect. In some case, the average velocity of the airflow over the entire surface of the through hole TH is less than 0.3 times of the free stream airflow velocity. Speaking more generally, as illustrated by the example above, as the diameter (or size) of the through hole TH is reduced below a low multiple of the boundary layer thickness $\delta$, the ratio between the area of the second subdivision THb and the total area of the through hole TH will increase rapidly such that the average velocity of airflow through the through-hole TH will be reduced significantly, allowing the pressure difference between the space inside the first air chamber CH1 (chamber pressure) and the ambient outside of the first air chamber CH1 to be better maintained. Therefore, instead of using one or a few large through-holes TH to achieve a certain total surface area S, it will be more advantageous to divide the same total surface area S over a large number of small through-holes TH (e.g. using 1600 through-holes of 3 μm diameter to replace four through-holes of 60 μm diameter), such that the ratio of the total through-hole surface area falling within distance $\frac{1}{2} \cdot \delta$ away from a boundary wall increases. Such increased airflow boundary layer effect leads to slower average airflow velocity through the same total through-hole surface area S, and therefore, improves the retention of pressure difference $\Delta P_r$ (in Eq. 5) across the through-hole TH.

According to the discussions above, since the size(s) of the through-hole TH may affect the maintenance of the chamber pressure, the total area of all through-holes TH and the size of individual through-hole TH need to be designed together, so as to achieve the target chamber pressure retention rate and the target acoustic pulse transmission effectiveness simultaneously. In a typical embodiment of the present invention, the total area S of the through-hole TH may range from 5% to 35% of the surface area of membrane 120, and the diameter (or opening width) of each through-hole may be less than or equal to 5 times (typically 0.6~3 times) the airflow boundary layer thickness δ corresponding to the surface condition and the curvature of through-hole TH, but not limited thereto. In some embodiments, at least half of the area (such as, the half area or the entire area) of the through hole TH may be within the boundary layer of the through hole TH, but not limited thereto.

Moreover, as shown in FIG. 1 and FIG. 2, in order to maximize the effectiveness of air pulse propagation, the through-hole TH should be located or distributed around area where displacement of the membrane 120 is large, wherein the displacement of the membrane 120 is defined as the amount of position change of the membrane 120 in the direction Dn during one of the pulse cycles CY. In some cases, the opening may correspond to a maximum displacement position of the membrane 120 defined as a position of the membrane 120 moving with a maximum displacement in one of the pulse cycles CY. For example, in FIG. 1 and FIG. 2 (also, in FIG. 5), the maximum displacement position of the membrane 120 is situated around the center of the membrane 120, and the through hole TH corresponds to the center of the membrane 120 in the direction Dn, but not limited thereto. In some cases, in the top view, the opening may correspond to the region of the membrane 120 where its range of displacement in the direction Dn is greater than a threshold value, wherein the threshold value may be 1.5 μm, but not limited thereto. In another aspect, in the top view, a center of a smallest region containing all opening(s) may correspond to the maximum displacement position of the membrane 120 in the direction Dn, wherein the smallest region may be any other suitable shape, such as a triangle, a rectangle, a polygon, a circle or a shape having a curved edge. For example, in FIG. 1, since only one through hole TH is included in the air pulse generating element 100, the smallest region containing this through hole TH may be a circular region of which the boundary is the same as the edge of through hole TH, and the center of this smallest region may correspond to the center of the membrane 120, but not limited thereto. In some case, in the top view, the center of this smallest region may correspond to the region of the membrane 120 where its range of displacement in the direction Dn is greater than the threshold value.

Also shown in FIG. 2 is the optional back enclosure, including the second faceplate 114 and the second sidewall 114w, configured to avoid the air pulses emitted toward the front (through the through-hole TH) from being cancelled by the air pulses emitted toward the back. The air pulse generating element 100 may further include an absorption object 140 disposed in the second air chamber CH2, wherein the absorption object 140 is configured to dissipate the ultrasonic acoustic energy of the air pulses emitted toward the back. In some embodiments, the absorption object 140 may be made of material such as sound absorbing foam, while in other embodiments, the sound absorption object 140 may be miscellaneous objects scattering within a host device of the sound producing device SD. However, since the air pulses emitted toward the back will be generated by membrane acceleration while the air pulses emitted toward the front will be generated by chamber compression, if the design of the first air chamber CH1 and its associated through-hole TH is done successfully, the SPL of the front radiating air pulses can be 10~50 times stronger than the back radiating pulses, so as to render the back enclosure (i.e., the second air chamber CH2) optional.

Figure 5:
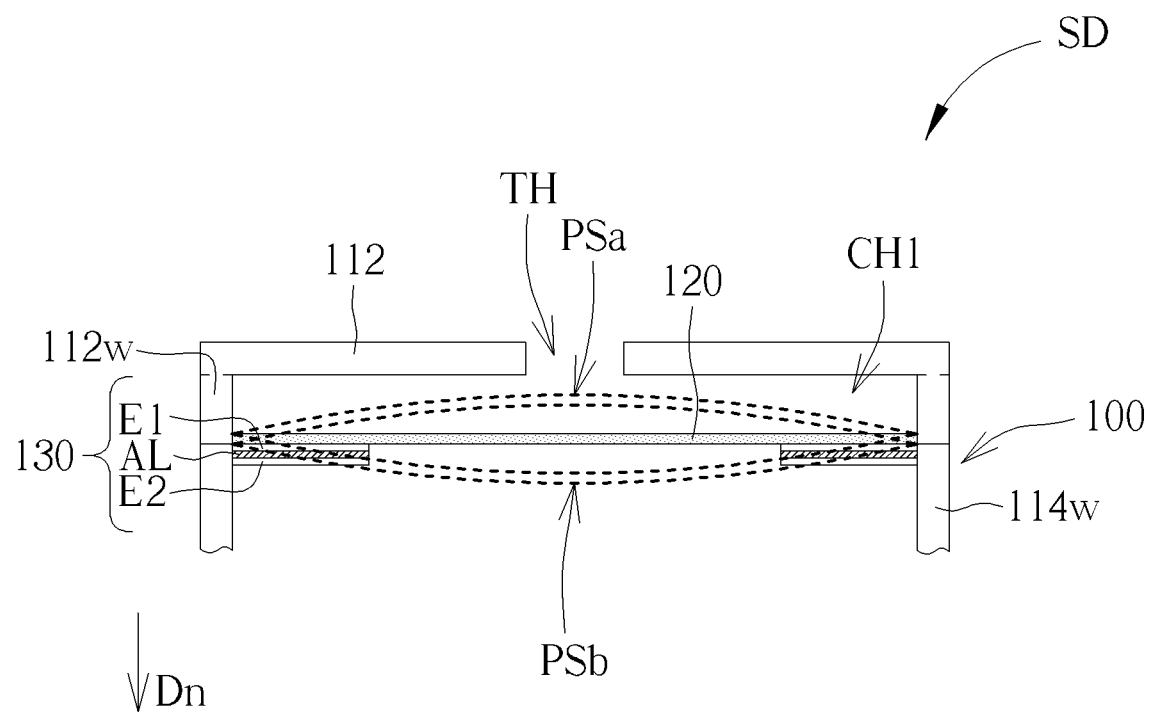
FIG. 5 is a schematic diagram of a cross sectional view illustrating an exemplary movement of the membrane according to the first embodiment of the present invention.

Referring to FIG. 5, FIG. 5 is a schematic diagram of a cross sectional view illustrating an exemplary movement of the membrane according to the first embodiment of the present invention, wherein FIG. 5 shows a portion of the sound producing device SD shown in FIG. 2, so as to clearly show the movement of the membrane 120. As shown in FIG. 5, the membrane 120 may be actuated to move along the direction Dn. When membrane 120 moves from position PSb toward position PSa (negative $\Delta Uz$), the chamber volume inside the first air chamber CH1 is reduced (i.e. compressed), resulting in positive air pressure change $\Delta P$ as expressed by Eq. 3. Thus, a positive air pulse is generated when the first air chamber CH1 is compressed. Alternatively, when membrane moves from position PSa toward position PSb (positive $\Delta Uz$), the chamber volume of the first air chamber CH1 is increased (i.e. expanded), resulting in negative air pressure change $\Delta P$. Thus, a negative air pulse is generated when the first air chamber CH1 is expanded. As the result, the membrane 120 is actuated to change the chamber volume of the first air chamber CH1 to change the value of the chamber pressure (i.e., chamber pressure value), and the air pulses are generated by changing the value of the chamber pressure. Moreover, instead of moving between position PSa and position PSb in a single step, membrane 120 may be actuated to move in a step-by-step manner to generate air pulses of same polarity in multiple pulse cycles.

Referring to FIG. 6 for detailed explanation of an embodiment of actuator driving signal of one pulse cycle according to an embodiment of the present invention. Also, various responses as a result of the driving signal are illustrated in FIG. 6, from the top to bottom:

Plot #1 is one pulse cycle of a unit driving signal corresponding to a unit strength pulse, Plot #2 is the membrane displacements corresponding to the driving signal of plot #1, Plot #3 is the chamber pressure changes corresponding to the membrane displacement plot #2, and Plot #4 is the pressure difference between the first air chamber CH1 and the surrounding ambient of the sound producing device SD.

Briefly, as illustrated in the plots of FIG. 6, when driving signal (plot #1 of FIG. 6) is applied to the actuator 130 of the air pulse generating element 100 in FIG. 2, the membrane 120 moves (plot #2 of FIG. 6) in response to each step of the driving signal, causing the chamber volume of the first air chamber CH1 to change accordingly. The volume changes of the first air chamber CH1 cause the chamber pressure (i.e., the air pressure within the first air chamber CH1) to vary (plot #3 of FIG. 6) and the sequence of such pressure changes within the first air chamber CH1 result in the formation of air pulse which is subsequently propagated through through-hole TH (i.e., the opening) to the surrounding ambient and audible sound is thusly created through the envelope of a series of these air pulses.

More specifically, refer to illustrations in FIG. 6, each pulse cycle CY starts with a pulse-generating time segment PGS followed by a pulse-isolating time segment PIS. In addition, the time segments PGS and PIS are each further subdivided into a $1^{st}$ shorter period where the membrane moves and a $2^{nd}$ longer period where the membrane maintains its position, wherein the pulse-generating time segment PGS is subdivided into a rising period Tr being $1^{st}$ shorter period and a maintaining period Tm being $2^{nd}$ longer period, and the pulse-isolating time segment PIS is subdivided into a falling period Tf being $1^{st}$ shorter period and an isolation period Ti being $2^{nd}$ longer period. A driving signal DRS is applied on the actuator 130 in the pulse cycle CY, wherein the segments of the driving signal DRS corresponding to the periods Tr, Tm, Tf and Ti will be referred to as a first part S1, a second part S2, a third part S3 and a fourth part S4 respectively, as illustrated in plot #1 of FIG. 6.

Refer to the plots of one pulse cycle CY in FIG. 6, after applying driving signal DRS (plot #1 of FIG. 6) to the membrane 120, the membrane 120 moves (plot #2 of FIG. 6) from the initial position PS0 to the first position PS1 in the pulse-generating time segment PGS to cause the chamber pressure to change from a pressure value Pe to a first pressure value Pr1 (plot #3 of FIG. 6) in the first air chamber CH1 by changing the chamber volume of the first air chamber CH1 with the first membrane displacement L1, and the membrane 120 subsequently moves from the first position PS1 to the second position PS2 (corresponding to a second membrane displacement L2) in the pulse-isolating time segment PIS to neutralize the remaining pressure difference (i.e., the difference between a second pressure value Pr2 and the pressure value Pe of the ambient surrounding the sound producing device SD) within the first air chamber CH1 by changing the chamber volume of the first air chamber CH1 with a displacement Ld equaling to the difference between the first membrane displacement L1 and the second membrane displacement L2. More specifically, in the period of one pulse cycle CY, during the pulse-generating time segment PGS, the membrane 120 moves from its initial position PS0 to the first position PS1 during the rising period Tr and holds its position at the first position PS1 for the maintaining period Tm; during the pulse-isolating time segment PIS, the membrane 120 moves from the first position PS1 toward the second position PS2 during a falling period Tf, and the membrane 120 stays at the second position PS2 and/or gradually moves for being close to the second position PS2 during an isolation period Ti, which is the remainder of the pulse cycle CY. For example, in some embodiments, in the isolation period Ti, the membrane 120 may move for being close to the second position PS2 before the membrane 120 stays at the second position PS2.

Note that, in the pulse cycle CY, the first membrane displacement L1 between the initial position PS0 and the first position PS1 creates a pressure change ΔP (i.e., Pr1–Pe) due to chamber compressing effect and such pressure change ΔP from inside to outside of the first air chamber CH1 causes a pressure gradient to be established through the length of the through-hole TH. Namely, in the beginning (i.e., the rising period Tr) of the pulse-generating time segment PGS, a first rapid pressure change PC1 occurs in the first air chamber CH1. The pressure gradient causes the acoustic wave to be generated through collisions among free-moving air molecules and the acoustic wave will propagate to the ambient surrounding the air pulse generating element 100 through the through-hole TH. At the same time the acoustic wave is generated and propagated, the same pressure gradient due to the pressure change ΔP will also create a kinetic airflow though through-hole TH. Due to such airflow, either out of or into the first air chamber CH1, the total air mass within the first air chamber CH1 changes during the pulse-generating time segment PGS, and the first pressure value Pr1 drops to the second pressure value Pr2 at the end of the pulse-generating time segment PGS. Note that, in plot #3 of FIG. 6, the second pressure value Pr2 is between the first pressure value Pr1 and the pressure value Pe. Therefore, the second membrane displacement L2, corresponding to the second position PS2 of the pulse-isolating time segment PIS, should produce a net volume change equals to the amount of air mass flown through through-hole TH during the pulse-generating time segment PGS. In this embodiment, in the beginning (i.e., the falling period Tf) of the pulse-isolating time segment PIS, a second rapid pressure change PC2 occurs in the first air chamber CH1, and a change value of the first rapid pressure change PC1 and a change value of the second rapid pressure change PC2 have different signs (for instance, in FIG. 6, if the change value of the first rapid pressure change PC1 is a positive value, the change value of the second rapid pressure change PC2 is a negative value). For example, an absolute value of an instantaneous changing rate of the first rapid pressure change PC1 and an absolute value of an instantaneous changing rate of the second rapid pressure change PC2 may be greater than 100 Pa/μs. Furthermore, after the second rapid pressure change PC2, the pressure value of the chamber pressure gradually changes to be close to the pressure value of the ambient pressure outside the first air chamber CH1 (e.g., the pressure value Pe shown in plot #3 of FIG. 6).

Refer to plot #4 "Pressure Difference" of FIG. 6, as discussed in the prior paragraph, the design and operation of the air pulse generating element 100 should be tuned such that, at the end of the pulse-isolating time segment PIS, which is also the end of the pulse cycle CY, the pressure inside the first air chamber CH1 should approximately equal the ambient pressure outside the first air chamber CH1 (e.g., the pressure value Pe shown in plot #3 of FIG. 6). In case substantial pressure difference lingers around (i.e. pressure within the first air chamber CH1 is different than the ambient pressure outside the first air chamber CH1) after the end of a pulse cycle CY, such residual pressure will cause pulse-to-pulse interferences and degrades the quality of sound thus produced.

Specifically, as shown in plot #4 of FIG. 6, the pressure value of the chamber pressure is different from the pressure value of the ambient pressure outside the sound producing device SD during the pulse-generating time segment PGS, and the pressure value of the chamber pressure is equal to the pressure value of the ambient pressure outside the sound producing device SD by the end of the pulse-isolating time segment PIS. In other words, the pressure difference Pd is not zero during the pulse-generating time segment PGS, and the pressure difference Pd is substantially zero toward the end of the pulse-isolating time segment PIS. In detail, the chamber pressure and the pressure difference Pd are explained in the following. During the rising period Tr of the pulse-generating time segment PGS, the chamber pressure is changed because the membrane 120 moves from the initial position PS0 to the first position PS1, such that the pressure difference Pd may reach a characteristic pressure difference value CPV (i.e., the characteristic pressure difference value CPV is equal to the difference of the first pressure value Pr1 and the pressure value Pe). That is to say, the characteristic pressure difference value CPV depends on the first membrane displacement L1 from the initial position PS0 to the first position PS1. During the maintaining period Tm of the pulse-generating time segment PGS, although the membrane 120 may maintain at the first position PS1, the magnitude of the pressure difference Pd will drop owing to the airflow through the through-hole TH of the air pulse generating element 100. In FIG. 6, the chamber pressure is decreased from the first pressure value Pr1 to the second pressure value Pr2 during the maintaining period Tm, for instance. During the falling period Tf of the pulse-isolating time segment PIS, the pressure difference Pd is decreased when the membrane 120 moves from the first position PS1 toward the second position PS2. By or before the end of the pulse-isolating time segment PIS, the membrane 120 reaches the second position PS2, and the pressure difference Pd within the first air chamber CH1 is substantially 0. Namely, the air pressure within the first air chamber CH1 achieves balance with that of the ambient surrounding the first air chamber CH1.

In particular, during the pulse-generating time segment PGS, the acoustic wave is propagated through the through-hole TH owing to the pressure gradient created by the pressure difference Pd through the length of the through hole TH. Although the membrane 120 does not move during the maintaining period Tm, the differential molecule collision frequency due to the non-zero pressure difference Pd will cause acoustic pressure to be continuously generated and propagated throughout the maintaining period Tm. At the same time, because of the non-zero pressure difference Pd during the pulse-generating time segment PGS, the air will flow out of, or into, the first air chamber CH1 through the through-hole TH depends on the sign of the pressure difference Pd. Thus, the magnitude of pressure difference Pd will fall along the course of the pulse-generating time segment PGS. Therefore, the second position PS2 in the pulse-isolating time segment PIS needs to exist for generating a change of the chamber volume of the first air chamber CH1, and this change of the chamber volume equals to the volume of the air flowing in/out the first air chamber CH1 during the entire pulse cycle CY. Accordingly, by the end of the pulse-isolating time segment PIS, the pressure difference Pd within the first air chamber CH1 may become 0.

Figure 18:
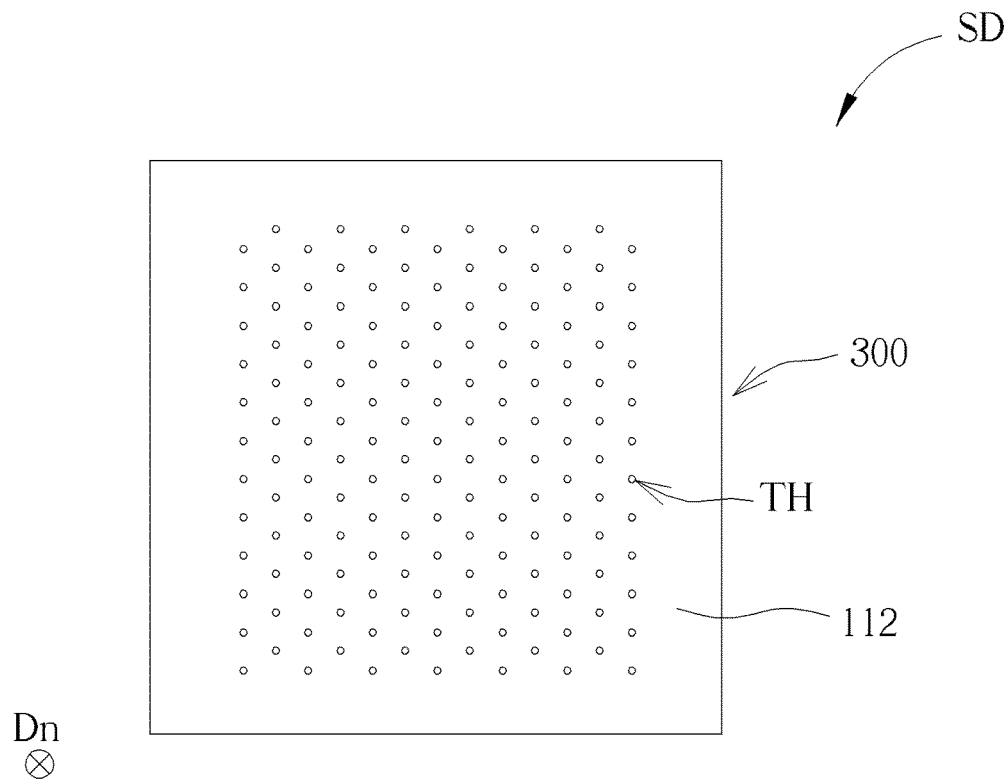
FIG. 18 is a schematic diagram of a top view illustrating an air pulse generating element of a sound producing device according to a third embodiment of the present invention.

In the discussion above, notice the contrasts between the wave and the flow and between the acoustic and the kinetic, while both effects are results of the same pressure change ΔP created by the first membrane displacement L1 of the membrane 120, the acoustic wave involves no air mass movement and travels at the speed of sound, while the airflow involves air mass movement and travels at a velocity according to v=a·t. Therefore, these two phenomena are clearly distinct even though they share the same cause and occur at the same time. Refer to FIG. 3 and FIG. 4 and their associated discussions, it is a feature of the present invention to slow down the airflow by increasing the boundary layer effect with small diameter (size) individual through holes TH, while increasing the acoustic wave propagation efficiency with a relatively large total surface area S of all the through holes TH. Refer to FIG. 18 where a first faceplate 112 embodying the ideas discussed above is illustrated.

In general, it is desirable to make the pulse-generating time segment PGS as long as possible while keeping the pulse-isolating time segment PIS as short as possible, as long as the pressure difference (plot #4 of FIG. 6) approaches zero as at the end of each pulse cycle. The minimum length of the pulse-isolating time segment PIS is mainly determined by the response time of the membrane 120. But faster response time also means stiffer membrane, which leads to reduced range of membrane displacement and results in lower initial pressure change ΔP (i.e., Pr1−Pe). Therefore, a compromise between the faster membrane response time and the larger membrane displacement needs to be made. In practice, for the pulse rate of 72 kHz with the pulse cycle CY of 13.89 μs, the length of the pulse-generating time segment PGS may be 9~11 μs while the length of the pulse-isolating time segment PIS may be of 3~5 μs (i.e., the pulse-generating time segment PGS is two to three times longer than the pulse-isolating time segment PIS), but not limited thereto.

In order to achieve the movement of the membrane 120 and the change of the chamber pressure, the suitable driving signal DRS needs to be provided. For example, in this embodiment, the driving signal DRS shown in plot #1 of FIG. 6 is provided. Note that, a basic assumption behind the driving voltage generation process above is: the position of the membrane 120 is correlated to the driving voltage applied to the actuator 130 in a substantially linear manner. Specifically, in plot #1 of FIG. 6, the voltage level of the first part S1 may be the same as the voltage level of the second part S2 (such as a voltage level V1) to maintain the membrane 120 at the first position PS1, the voltage level of the third part S3 may be different from the voltage level of the first part S1 and the voltage level of the second part S2 to make the membrane 120 move from the first position PS1 toward the second position PS2, and the voltage level of the fourth part S4 may be different from the voltage level of the first part S1 and the voltage level of the second part S2 to maintain the membrane 120 at the second position PS2. Then, as an example, the voltage level of the fourth part S4 may be the same as the voltage level of the third part S3 (such as a voltage level V4), but not limited thereto. According to the above, the driving signal DRS during the pulse-generating time segment PGS (i.e., the first part S1 and the second part S2) is different from the driving signal DRS during pulse-isolating time segment PIS (i.e., the third part S3 and the fourth part S4), and a similar situation is also shown in FIG. 8 to FIG. 12. Moreover, since the chamber volume of the first air chamber CH1 changes linearly with the displacement of the membrane 120, a change of the driving voltage will cause a corresponding linear change in the chamber volume of the first air chamber CH1, which leads to the change of chamber pressure correspondingly, which further leads to the air pulses being correspondingly generated due to the pressure difference Pd between the chamber pressure and an ambient pressure (i.e., Pe) outside the sound producing device SD. This chain of action described above is illustrated from top to bottom in FIG. 6, where the chamber pressure and the pressure difference Pd are shown in plot #3 and #4 of FIG. 6 respectively.

In FIG. 6, the driving signal illustrated in FIG. 6 is a unit driving signal. The term of "unit driving signal" refer to the same concept as a unit vector, meaning the driving signal waveform of FIG. 6 can be converted to a converting driving signal of a particular pulse cycle by scaling and level-shifting. For example, the scaling factor may be the sampled value of the input signal corresponding to the present pulse cycle, or it may be the difference between two successive sampled values of the input signal, and the level-shift may equal to the ending driving signal voltage level of a pulse cycle preceding the present pulse cycle. Thus, in the two successive pulse cycles, the ending position (i.e., the second position) of the membrane 120 in the previous pulse cycle is the same as the starting position (i.e., the initial position) of the membrane 120 in the present pulse cycle.

Figure 7:
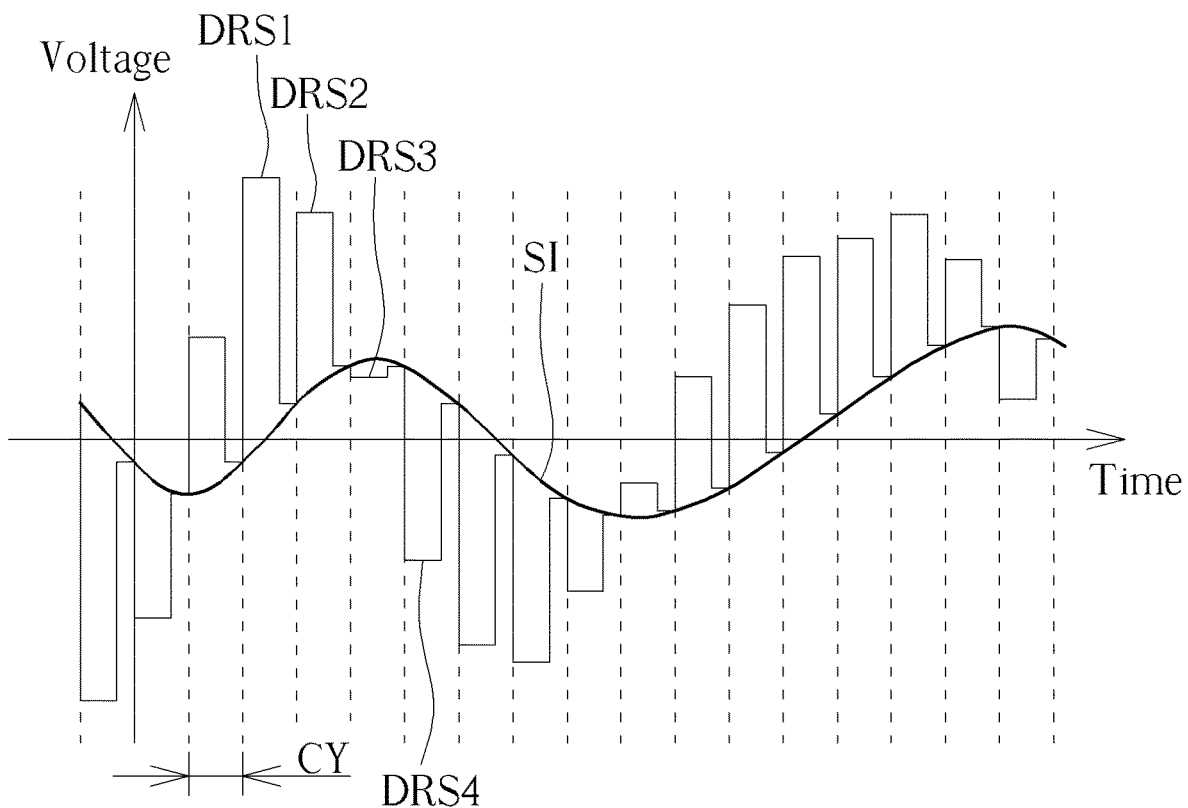
FIG. 7 is a schematic diagram illustrating a relationship between the driving signal and the input signal according to an embodiment of the present invention.

Refer to FIG. 7 for a relationship between the driving signal and the input signal according to an embodiment of the present invention, wherein four scaled-and-shifted driving signals DRS1~DRS4 respectively corresponding to four continuous pulse cycles CY are shown as an example. During the driving segments of the driving signals DRS1~DRS4, the membrane 120 is actuated to move to positions corresponding to the changing driving voltage levels, causing the chamber volume of the first air chamber CH1 to change accordingly and result in generation of four individual air pulses corresponding to the pulse-generating time segments PGS of the driving signals DRS1~DRS4. Noted that each of the four driving signals DRS1~DRS4 is a scaled-and-shifted version of unit driving waveform shown in FIG. 6 where the scaling factors equal to the change of input signal SI over the time period of the corresponding pulse cycle CY. That is to say, the displacement Ld in FIG. 6 corresponds to the difference between two successively sampled values of the input signal SI. For example, the input signal SI increased significantly over the period of the pulse cycle CY corresponding to the driving signal DRS1, therefore, the driving signal DRS1 is scaled by a positive large number proportional to the change of the input signal SI during pulse cycle CY corresponding to the driving signal DRS1; on the other hand, the input signal SI decreased slightly over the period of the pulse cycle CY corresponding to the driving signal DRS3, therefore, the driving signal DRS3 is scaled by a small negative number proportional to the change of the input signal SI during pulse cycle CY corresponding to the driving signal DRS3. After having been scaled properly, the scaled driving signals DRS1~DRS4 are level-shifted such that the ending voltage level of the preceding pulse cycle CY equals to the starting voltage level of the current pulse cycle CY, as illustrated by the seamless concatenation between driving signals DRS1~DRS4 in FIG. 7.

Figure 8:
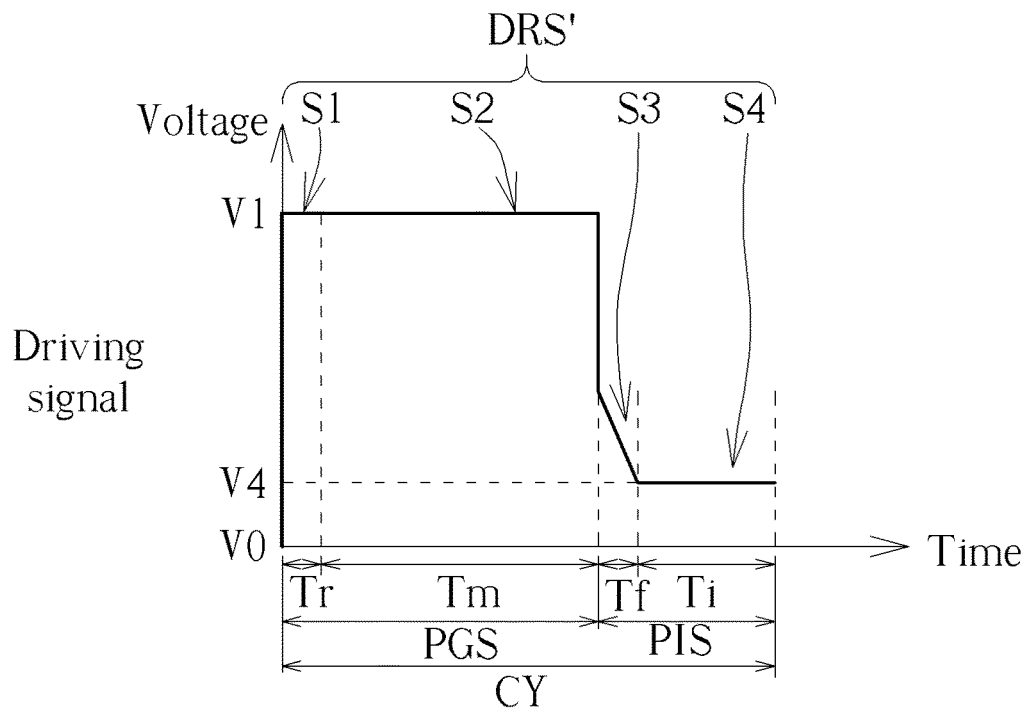
FIG. 8 is a schematic diagram illustrating a driving signal according to another embodiment of the present invention.

More specifically, when generating the scaled driving signals for continuous pulse cycles CY, unit driving signal, such as DRS of FIG. 6 or DRS' of FIG. 8, will first be scaled corresponding to the sampled value(s) of the input signal to produce the scaled driving signal, this scaled driving signal is then level-shifted such that the voltage level V0, after level-shifting, of the current pulse cycle equals the voltage level V4 of the pulse cycle preceding the current pulse cycle, such that the resulting series of scaled-and-shifted driving signals can be concatenated together seamlessly.

Moreover, notice that, in the discussion above, the effect of conventional acoustic wave generation by membrane acceleration was not taken into consideration. An analysis of the membrane displacement (plot #2) of FIG. 6 will reveal that an acoustic pulse of polarity opposite to the acoustic wave generated by the pressure difference Pd will occur during the falling period Tf due to the actuation force applied to the membrane 120 to move the membrane 120 from the first position PS1 to the second position PS2. Since this acoustic pulse can nullify portion of the acoustic output generated by the pressure difference Pd, it is desirable to minimize the magnitude of such acoustic pulse. Referring to the driving signal DRS' in FIG. 8 or the driving signal DRS" in FIG. 9, the voltage level of the third part S3 of the driving signal, instead of being square like the third part S3 of DRS in FIG. 6, has a slope (e.g., the driving signal DRS' in FIG. 8) or a curve (e.g., the driving signal DRS" in FIG. 9). In other words, the voltage level of the third part S3 is different from the voltage level of the fourth part S4. Thus, the acceleration of the membrane 120 is raised gradually and the acoustic pressure due to the membrane acceleration is reduced.

Figure 9:
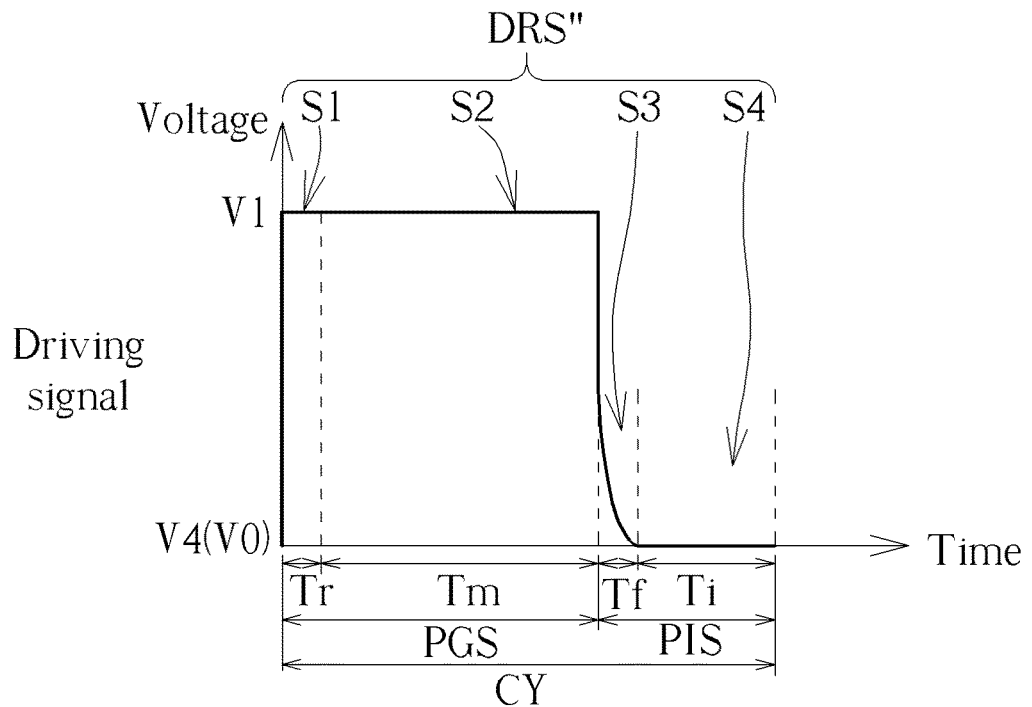
FIG. 9 is a schematic diagram illustrating a driving signal according to still another embodiment of the present invention.

In situations where the ratio of $$\frac{Pr1 - Pr2}{Pr1}$$

is small, for example less than ⅒, then the volume of the air flowing in or out of the first air chamber CH1 during the pulse-generating time segment PGS may be ignored in the design of the driving signal and the membrane 120 may simply move from the first position PS1 back to the initial position PS0 during the pulse-isolating time segment PIS (i.e., the second position PS2 described above is the same as the initial position PS0), such that a net displacement of the membrane 120 is zero over the pulse cycle CY. That is to say, the voltage level V4 is equal to the voltage level V0, and the second position PS2 is the same as the initial position PS0. In the two successive pulse cycles, the ending voltage level of driving signal DRS" (i.e., the voltage level of the fourth part S4) in the previous pulse cycle is the same as the ending voltage level of driving signal DRS" (i.e., the voltage level of the fourth part S4) in the present pulse cycle, such that the second position in the previous pulse cycle is the same as the second position in the present pulse cycle. Accordingly, another driving signal DRS" shown in FIG. 9 is provided. In the driving signal DRS" shown in FIG. 9, the fourth part S4 applied during the pulse-isolating time segment PIS will be voltage level V0, the initial voltage level of the pulse cycle, so as to return the membrane 120 back to its initial position PS0 by the end of pulse cycle CY.

One factor that will contribute to the condition of $$\frac{Pr1 - Pr2}{Pr1} \leq \frac{1}{10}$$

is to make the length of the pulse-generating time segment PGS (hereafter, the length of the pulse-generating time segment PGS is referred as $T_{PGS}$, the length of the pulse-isolating time segment PIS is referred as $T_{PIS}$, and the length of the pulse cycle CY is referred as $T_{CY}$) small to reduce the speed of airflow from building up, for example, by raising the ratio of $T_{PIS}/T_{PGS}$. As an example, let's analyze a steady state where an infinitely long chain of UPA of equal amplitude and same polarity is being generated and $T_{PIS}/T_{PGS}$=n, where n>>1 (i.e., the length of the pulse-isolating time segment PIS is much longer than the length of the pulse-generating time segment PGS). Since, the net airflow over the pulse cycle CY will be zero during steady state, by Newton laws $$D = \frac{1}{2} a \cdot t^2,$$

we can derive $\Delta P_{PGS}/\Delta P_{PIS} \approx -n^2$, assuming membrane response is very fast, which leads to $SPL_{CY} \propto$ $$\int_{t=0}^{t=T_{CY}} \Delta P_t \cdot dt = \qquad \text{(Eq. 6)}$$

$$\int_{t=0}^{t=T_{PGS}} \Delta P_t \cdot dt + \int_{t=T_{PGS}}^{t=T_{CY}} \Delta P_t \cdot dt \propto [n^2 \cdot 1 + (-1) \cdot n] = n(n-1),$$

i.e. $SPL_{CY} \propto n(n-1)$, wherein $SPL_{CY}$ is the net SPL over one pulse cycle CY. Therefore, $SPL_{CY}>0$ when n>1, even when an infinitely long chain of UPA of same polarity is being generated, with zero net airflow over each pulse cycle CY. By normalizing Eq. 6 relative to peak-to-peak SPL=$n^2$+1 and the pulse cycle CY (i.e., $T_{CY}+T_{PGS}$)=n+1, Eq. 6 becomes $SPL_{CY} \propto (n^2+n)/(n^2+1)/(n+1)$ (Eq. 7). A simple numeric analysis will show that the value of Eq. 7 peaks at 0.15 when $n=T_{PIS}/T_{PGS} \approx 2.9$ and stays $\geq 0.14$ when n is between 2.2 and 4.1 (e.g., 2<n<4), i.e. the length of the pulse-isolating time segment PIS is approximately 2 times to 4 times the length of the pulse-generating time segment PGS.

Note that there are two simplifications assumed during the derivation of Eq. 6: infinitely fast membrane response time; and no ΔP change during the pulse-generating time segment PGS and the pulse-isolating time segment PIS. Both of these simplifications will lead to errors in Eq. 7 and the equation needs be adjusted according to the sound producing device SD behavior of each specific design. Nonetheless, Eq. 7 and the range of $T_{PIS}/T_{PGS}=2.2\sim4.1$ can serve as a good starting point in the planning phase of the sound producing device SD design project.

Figure 10:
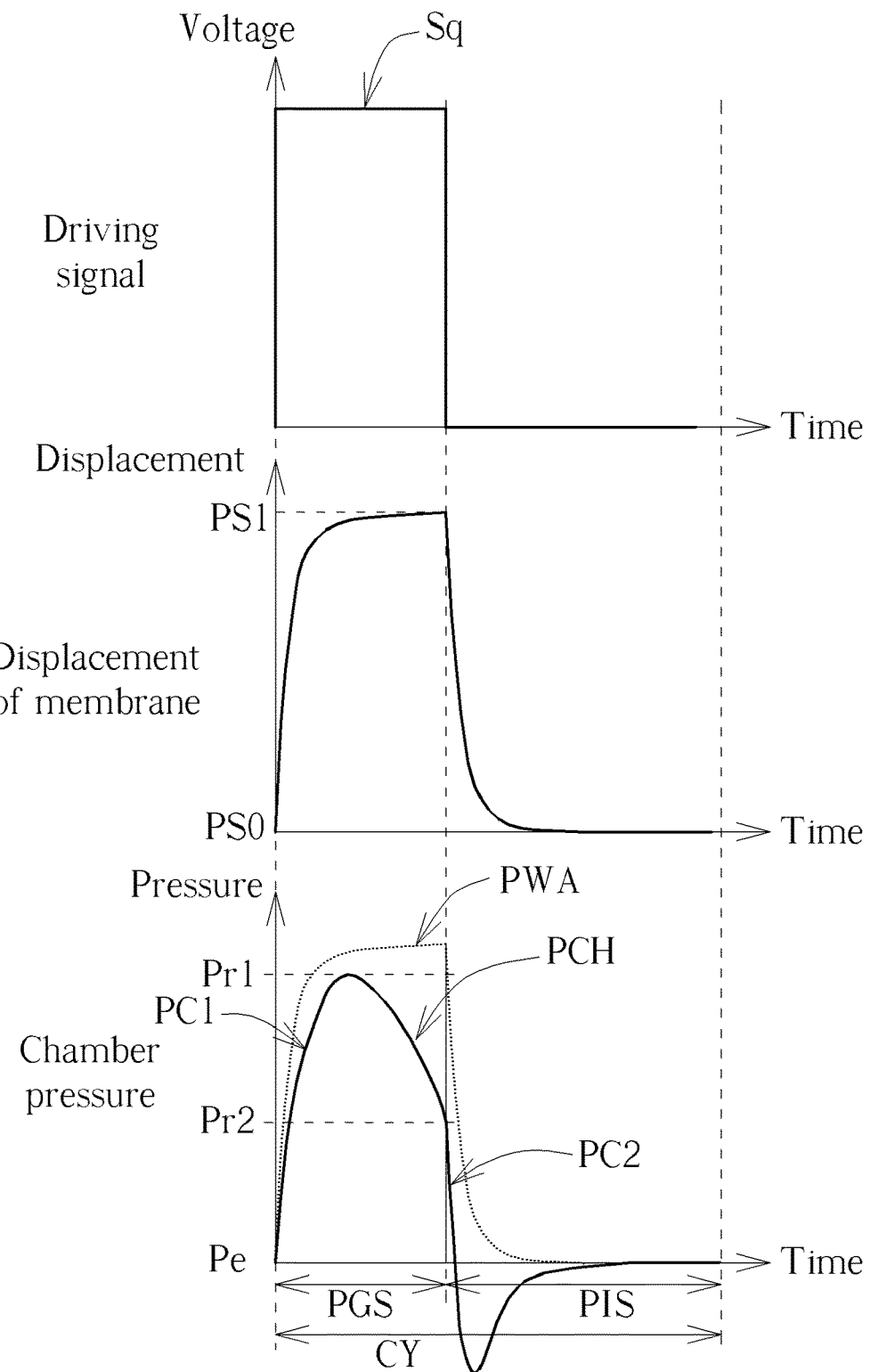
FIG. 10 is a schematic diagram illustrating a square wave driving signal, a displacement of a membrane and a chamber pressure according to an embodiment of the present invention.

In some embodiments, refer to FIG. 10 which illustrates a square wave driving signal Sq (plot #1 of FIG. 10), the displacement of the membrane 120 (plot #2 of FIG. 10) and the chamber pressure PCH (plot #3 of FIG. 10), wherein in the plot #3 of FIG. 10, the chamber pressure rises from the pressure value Pe to the first pressure value Pr1 during the rising period Tr while decaying from the first pressure value Pr1 to the second pressure value Pr2 during the maintaining period Tm. Note that, in the plot #3 of FIG. 10 (also in plot #3 of FIG. 11 and plot #3 of FIG. 12), an ideal pressure PWA, which omits the effect of the airflow through the through-hole TH or other effect, is also shown in dot line. As shown in plot #3 of FIG. 10, the significant airflow in the air pulse generating element 100 of FIG. 2 (or air pulse generating elements of other embodiments shown below, such as an air pulse generating element 400 of FIG. 20) during the pulse cycle CY is clearly revealed by comparing the chamber pressure PCH and the ideal pressure PWA. In other cases, by changing the square wave driving signal Sq into a sloped waveform driving signal Sp (shown in plot #1 of FIG. 11) or a curved waveform driving signal Su (shown in plot #1 of FIG. 12), where each of the driving signals Sp and Su reaches its peak driving voltage toward the end of the pulse-generating time segment PGS. As shown in plot #2 of FIG. 11 and plot #2 of FIG. 12, the gradual rising driving signal of the sloped waveform driving signal Sp or the curved waveform driving signal Su makes the membrane 120 move slowly compared with the plot #2 of FIG. 10, so as to cause the acceleration of airflow entering or escaping the first air chamber CH1 to be delayed toward the end of the pulse-generating time segment PGS and thusly reduce the net airflow over the course of the pulse-generating time segment PGS (as shown in plot #3 of FIG. 11 and plot #3 of FIG. 12). For driving signals Sp and Su, due to sloping nature of the driving signals Sp and Su, the ratio of $T_{PIS}/T_{PGS}=n$ needs to be replaced by generalized formula $$n = \frac{1}{DF} - 1,$$

where DF is duty factor. For example, a square wave driving signal Sq of DF=0.5 corresponds to n=1 in both formulas, but formula $$n = \frac{1}{DF} - 1$$

can reflect the curvature of driving signals Sp and Su while formula $n=T_{PIS}/T_{PGS}$ cannot. In addition, in plot #1 of FIG. 10, plot #1 of FIG. 11 and plot #1 of FIG. 12, the square wave driving signal Sq, the sloped waveform driving signal Sp and the curved waveform driving signal Su are driving signals applied during the pulse-generating time segment PGS.

Figure 11:
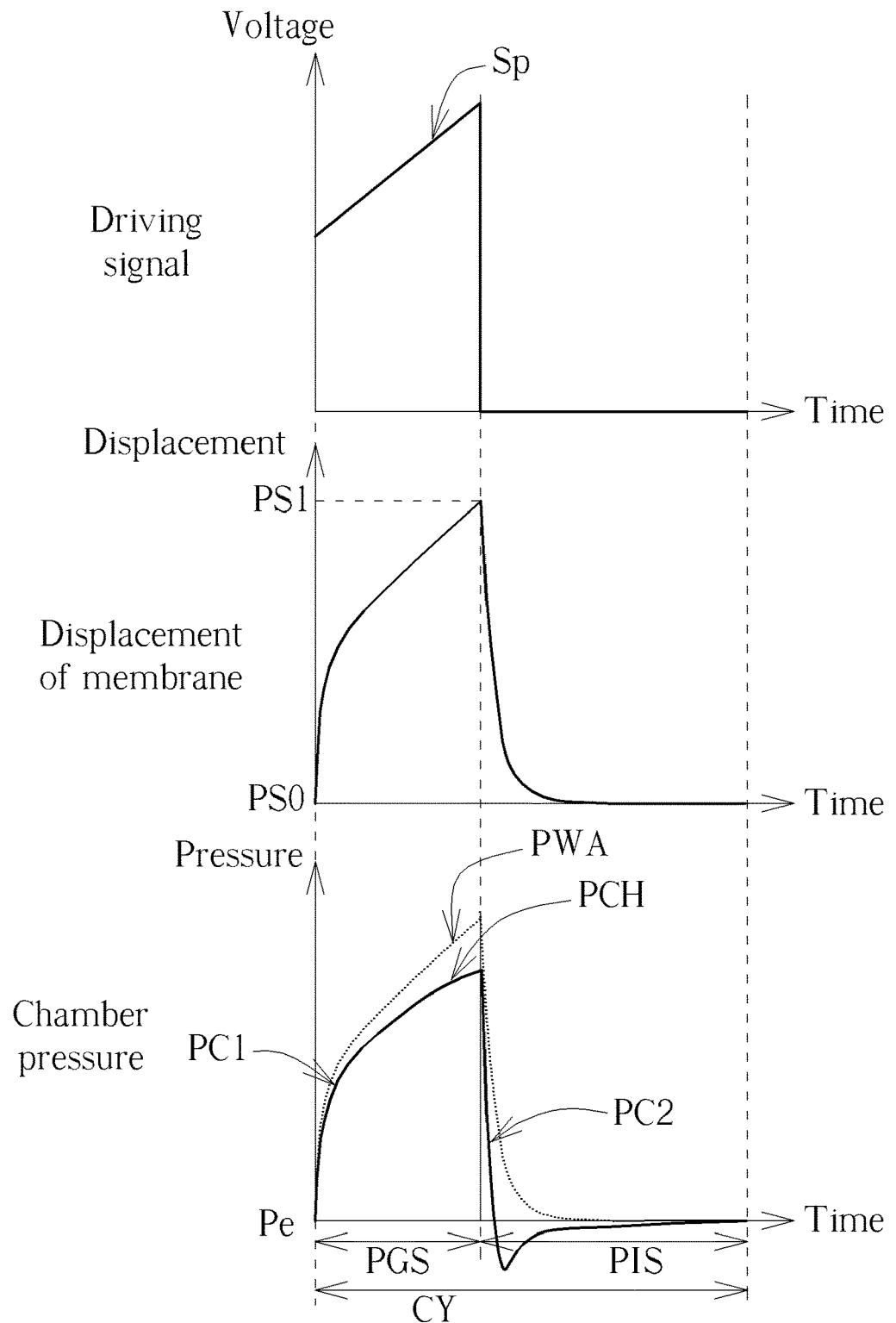
FIG. 11 is a schematic diagram illustrating a sloped waveform driving signal, a displacement of a membrane and a chamber pressure according to an embodiment of the present invention.
Figure 12:
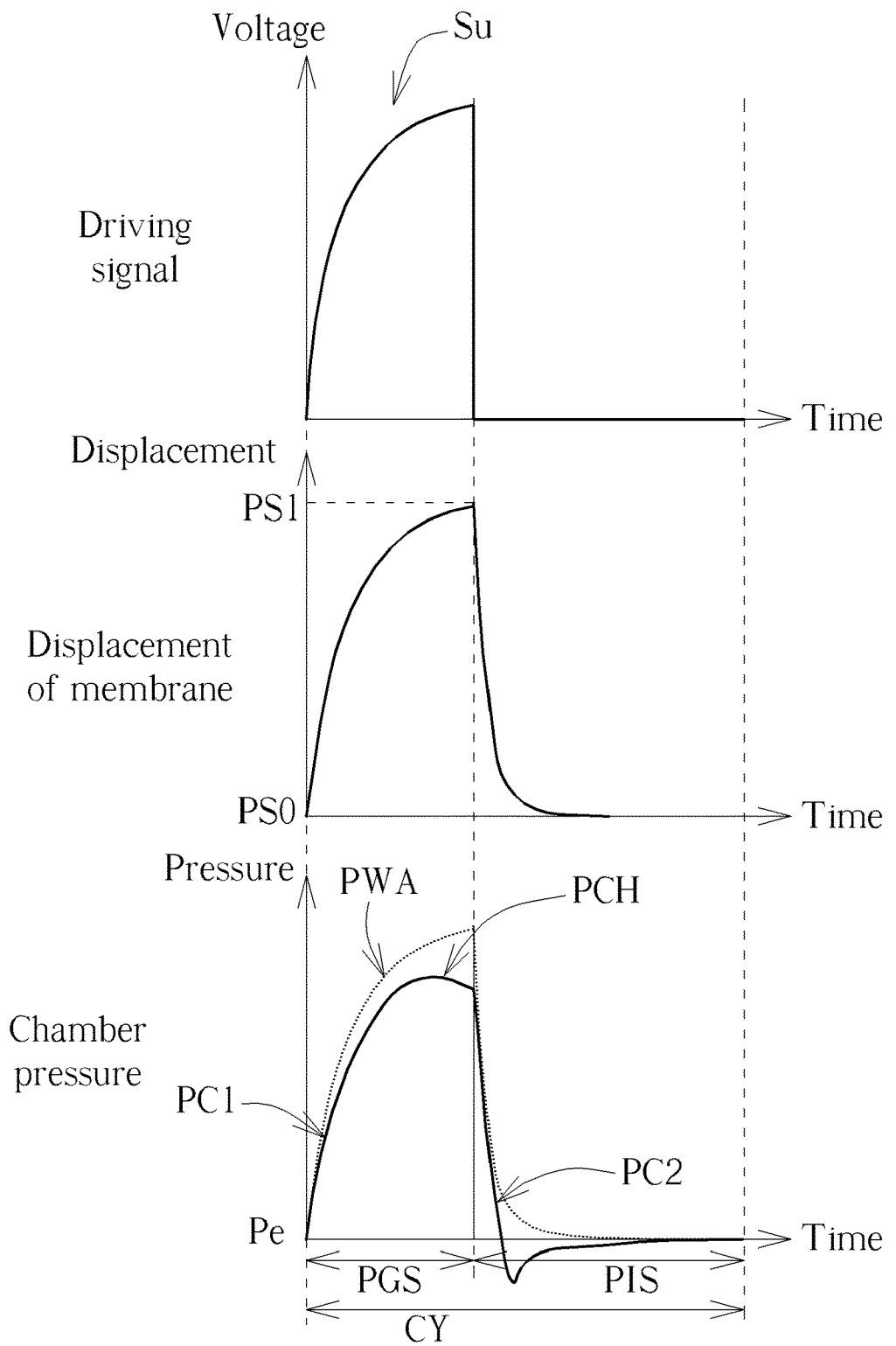
FIG. 12 is a schematic diagram illustrating a curved waveform driving signal, a displacement of a membrane and a chamber pressure according to an embodiment of the present invention.
Figure 13:
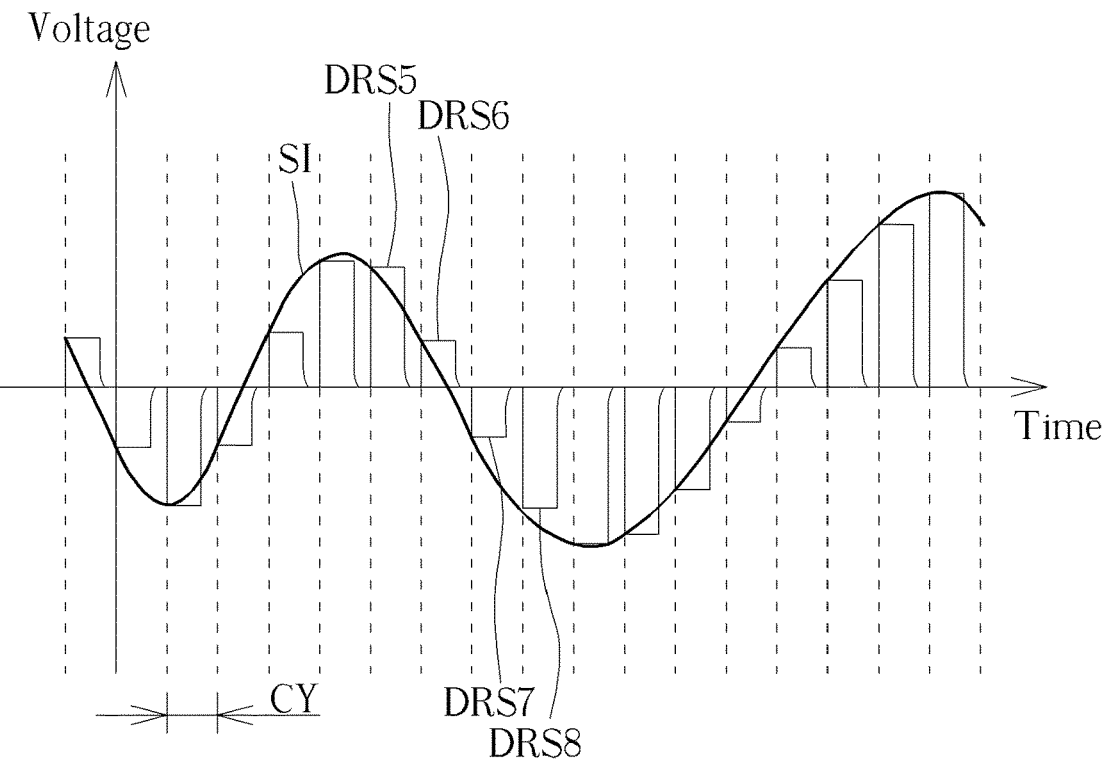
FIG. 13 is a schematic diagram illustrating a relationship between the driving signal and the input signal according to another embodiment of the present invention.

For driving signals shown in FIG. 10 to FIG. 12, due to the condition n>>1, the pressure inside the first air chamber CH1 will roughly return to the pressure value Pe at the end of pulse cycle CY, therefore, as illustrated in FIG. 9, the voltage level V4 can be set to be equal to the voltage level V0 in the driving signal DRS", and make the level-shifting step of the driving signal generation procedure discussed previously obsolete. In addition, the scaling factor for forming the scaled driving signal using the unit driving signal DRS" of FIG. 9 through FIG. 12 will also change to "sampled value of the input signal", instead of "difference between two successive samples of the input signal" as shown in FIG. 7. With these two changes mentioned above, the relationship between the driving signal and the input signal also changes, as illustrated in FIG. 13, wherein four scaled driving signals DRS5~DRS8, correspond to four consecutive pulse cycles CY respectively, are shown in FIG. 13 as an example. These four consecutive pulse cycles CY correspond to four consecutive sampling periods of the input signal SI, and the driving signals DRS5~DRS8 are scaled by the sampled value of the input signal SI at the start of each pulse cycle. That is to say, the displacement Ld between the initial position PS0 and the first position PS1 corresponds to the sampled value of the input signal SI at the start of each pulse cycle CY. Furthermore, in the two successive pulse cycles, the ending voltage level of driving signal in the previous pulse cycle (e.g., the driving signal DRS5) is the same as the ending voltage level of driving signal in the present pulse cycle (e.g., the driving signal DRS6).

Figure 14:
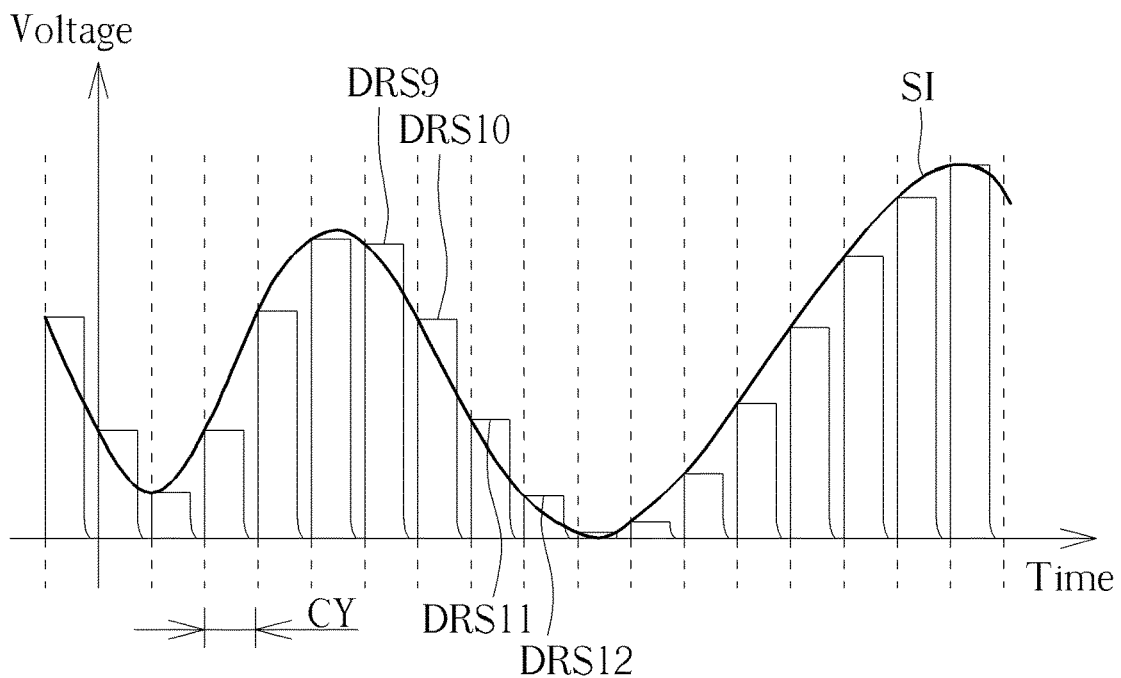
FIG. 14 is a schematic diagram illustrating a relationship between the driving signal and the input signal according to another embodiment of the present invention.

Note that, as discussed prior, when the ratio of $T_{PIS}/T_{PGS}$ is larger than 1, preferably the ratio of $T_{PIS}/T_{PGS}$ is between 2.2~4.1, but not limited thereto, an infinitely long chain of UPA of same polarity can be generated. This characteristic allows suitably designed driving signal DRS" to be used in an air-pressure-pulse-speaker (ΔPPS) based on single-ended-AM (SEAM) driving scheme, where an offset voltage is added to the input signal SI, as shown in FIG. 14, such that the net $SPL_{CY}$ generated in every pulse cycle CY will have the same polarity relative to the ambient pressure outside the sound producing device SD, and therefore the name of the modulation scheme "single-ended". That is to say, in each of the pulse cycles CY, the driving signal level during the pulse-generating time segment PGS (such as driving signals DRS9~DRS12 shown in FIG. 14) is always higher (or always lower) than the driving voltage level during the pulse-isolating time segment PIS, and the first position PS1 always situates on the same side of the initial position PS0 in each of the pulse cycles CY.

Note that, for SEAM driving scheme, as its name implied, it is mandatory that the sound producing device SD generates net $SPL_{CY}$ of the same polarity indefinitely, therefore, the level-shifting operation between consecutive pulse cycles CY depicted in FIG. 7 renders the driving signal DRS of FIG. 6 or the driving signal DRS' of FIG. 8 inadequate as the unit driving signal for SEAM. On the other hand, driving signal such as illustrated in FIG. 9 to FIG. 12 which does away with level-shifting between the pulse cycles CY and can produce net $SPL_{CY}$ of the same polarity indefinitely is suitable for SEAM driving scheme.

Referring to FIG. 15, FIG. 15 is a schematic diagram illustrating sound pressure levels (SPL) of air pulses generated by a sound producing device and an acoustic wave according to an embodiment of the present invention, wherein the acoustic wave SN shown in coarse line of FIG. 15 is a sinusoidal wave for example, and the air pulses AP are shown in fine line. As shown in FIG. 15, the SPL of each air pulse AP is related to the magnitude of the corresponding sampled value of the acoustic wave SN. The acoustic wave SN is produced by the contours (or envelope) of a plurality of air pulses AP. In order to preserve the fidelity of the acoustic wave SN produced by the contour of the air pulses AP, the pulse rate of the air pulses AP needs to be higher than twice the maximum input signal frequency, and preferably, higher than twice the maximum human audible frequency (i.e., 2×20 kHz=40 kHz). In some embodiments, the pulse rate may be higher than 72 kHz, so as to prevent house pets (e.g., cats can hear sound up to 50 kHz) from being annoyed by the air pulses AP or the alias due to the air pulses AP.

Figure 23:
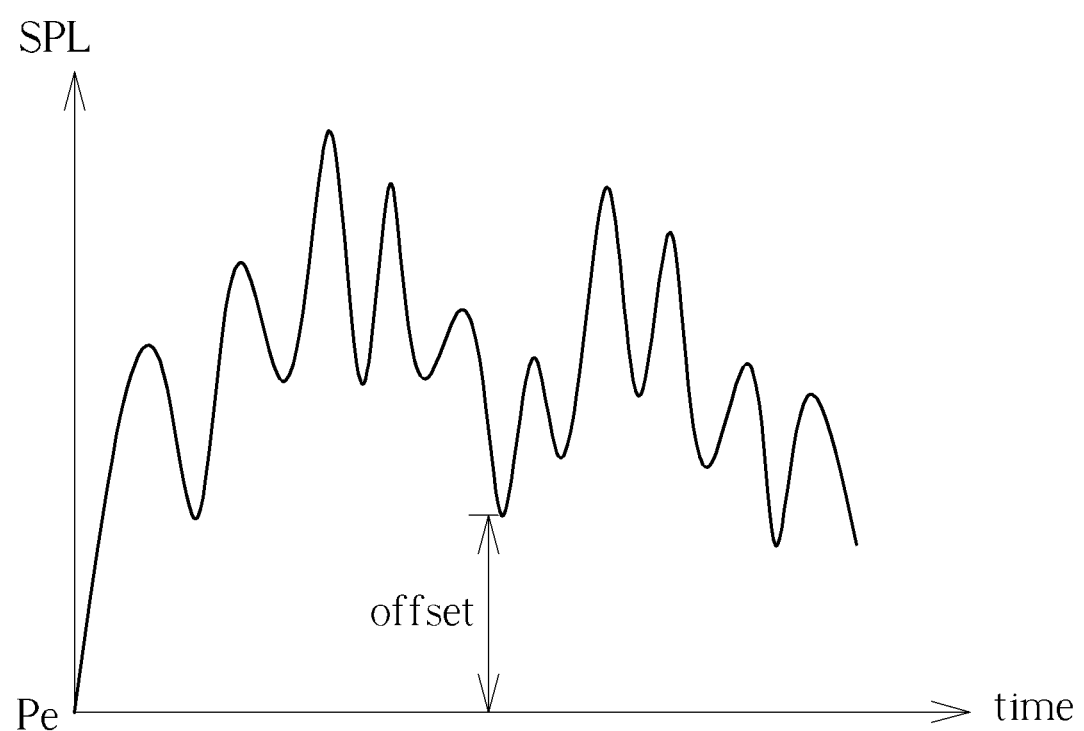
FIG. 23 is a schematic diagram illustrating a plurality of air pulses according to an embodiment of the present invention.

In some embodiments, similar to U.S. application Ser. No. 16/125,176 and Ser. No. 16/420,141, the air pulses generated by the sound producing device SD would have non-zero offset in terms of sound pressure level (SPL), where the non-zero offset is a deviation from the air pressure value of the ambient surrounding the sound producing device SD (i.e., the pressure value Pe). Also, the air pulses generated by the sound producing device SD are aperiodic over a plurality of pulse cycles. For example, FIG. 23 illustrates a schematic diagram of the air pulses generated by the sound producing device SD in terms of SPL. As can be seen from FIG. 23, the air pulses produce a non-zero offset in terms of SPL. In FIG. 23, the air pulses in terms of SPL would also be aperiodic over these 10 pulse cycles. Details of the "non-zero SPL offset" and the "aperiodicity" properties may be refer to U.S. application Ser. No. 16/125,176, which are not narrated herein for brevity.

Figure 16:
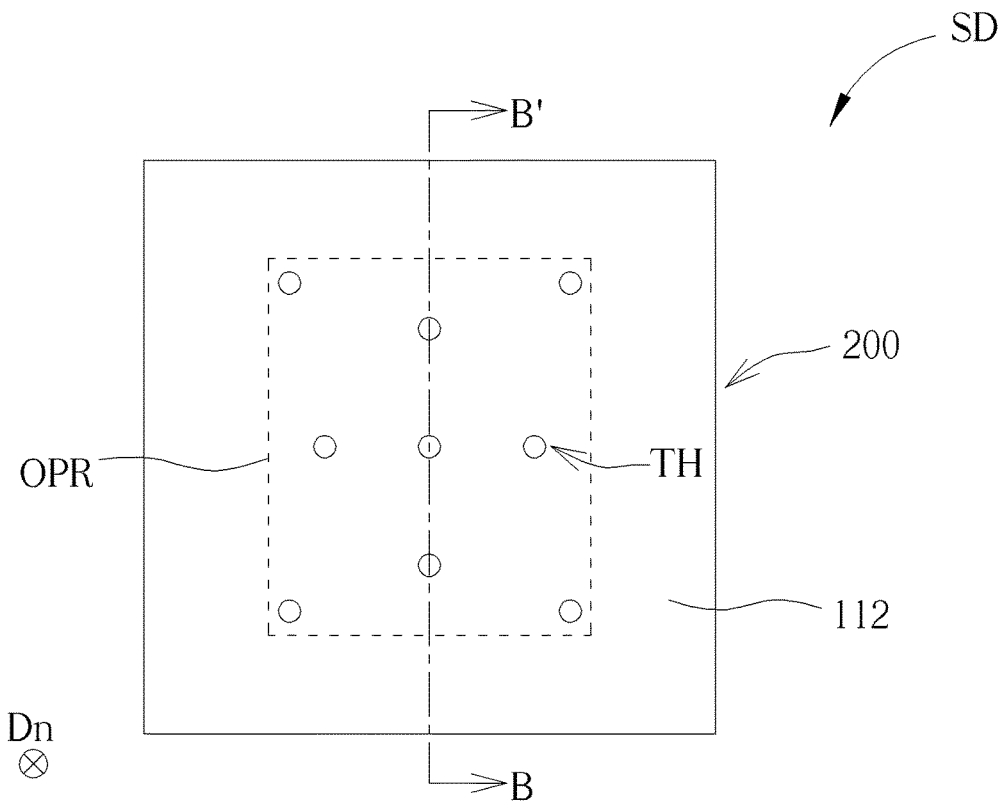
FIG. 16 is a schematic diagram of a top view illustrating an air pulse generating element of a sound producing device according to a second embodiment of the present invention.
Figure 17:
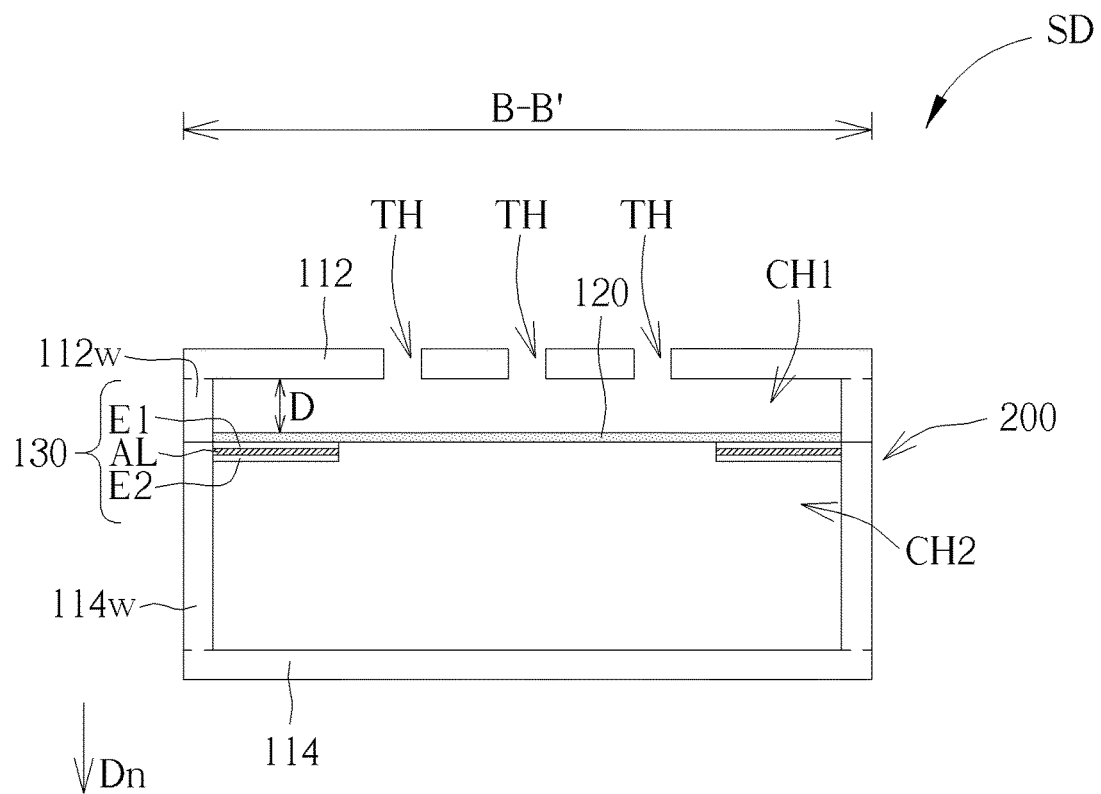
FIG. 17 is a schematic diagram of a cross sectional view taken along a cross-sectional line B-B' of FIG. 16.

Referring to FIG. 16 and FIG. 17, FIG. 16 is a schematic diagram of a top view illustrating an air pulse generating element of a sound producing device according to a second embodiment of the present invention, and FIG. 17 is a schematic diagram of a cross sectional view taken along a cross-sectional line B-B' of FIG. 16. Compared to the first embodiment, the air pulse generating element 200 of FIG. 16 and FIG. 17 includes nine through holes TH. If all other parameters are kept the same, by making the diameter of through holes TH in this second embodiment ⅓ of that in the first embodiment, the boundary layer effect will be increased by enhancing a ratio of the area of the second subdivision THb to the area of the first subdivision THa as discussed before, and this will reduce the speed of airflow and cause less drop of the pressure difference Pd during the pulse-generating time segment PGS. In addition, compare the first faceplate 112 of FIG. 16 to the first faceplate 112 of FIG. 1, these nine through-holes TH are far more uniformly distributed in the second embodiment, spreading uniformly over membrane surface area with a specific distance, than in the first embodiment. Such uniform distribution leads to shorter and more uniform traveling distance from the squeeze-film compressing region to the through holes TH and thus improve the effectiveness of the first faceplate 112 in terms of both acoustic pressure generation and acoustic pressure transmission. In some embodiments, the distance between two of the openings (e.g., the through holes TH) is far less than the distance D between the membrane 120 and the first faceplate 112. For example, the distance between two adjacent through holes TH is less than ½ times the distance D between the membrane 120 and the first faceplate 112, but not limited thereto.

Moreover, in FIG. 16 and FIG. 17, the distribution of through holes TH (or the openings) may center around to the maximum displacement position of the membrane 120 in the direction Dn. For example, if the maximum displacement position of the membrane 120 is situated at the center of the membrane 120, then the distribution of the through holes TH may center around the center of the membrane 120 in the direction Dn. In another aspect, in the top view, the center of the smallest region containing all of the openings may correspond to a region of the membrane 120 where the range of the membrane displacement in the direction Dn is greater than a threshold value. For instance, in FIG. 16, in the top view, the smallest region containing all of the through holes TH (such as a rectangular region OPR shown in FIG. 16) may correspond to the region of the membrane 120 where its range of displacement in the direction Dn is greater than such as 1.5 µm, but not limited thereto. In some cases, the center of the smallest region containing all of the openings may correspond to center of the membrane 120 or the maximum displacement position of the membrane 120, but not limited thereto. In some cases, one of the openings (such that the central through hole TH in FIG. 16) may correspond to center of the membrane 120 or the maximum displacement position of the membrane 120 in the direction Dn, but not limited thereto. In some cases, in the top view, one of the openings (such that the central through hole TH in FIG. 16) may correspond to the region of the membrane 120 where its range of displacement in the direction Dn is greater than threshold value (such as 1.5 µm). Similar, the smallest region including all of the opening also exists in the embodiments shown in FIG. 18 and FIG. 19, but in order to make the figures clear, these smallest regions are omitted in FIG. 18 and FIG. 19.

Referring to FIG. 18, FIG. 18 is a schematic diagram of a top view illustrating an air pulse generating element of a sound producing device according to a third embodiment of the present invention. As shown in FIG. 18, compared to the second embodiment, a much larger number of much smaller sized through holes TH are disposed on the first faceplate 112 of the air pulse generating element 300 of the sound producing device SD. For example, each of the through holes TH may have a diameter in the range of 1~5 times the boundary layer thickness δ, corresponding to the surface condition and curvature of the through-hole TH, and the number of the through holes TH may be greater than or equal to 100 (such as 100~10,000), such that the total area of the through holes TH may be 5~40% of the area of the membrane 120. As a practical example, each of through-hole TH has the diameter less than or equal to 5 µm, such as 0.8~5.0 µm, but not limited thereto.

Figure 19:
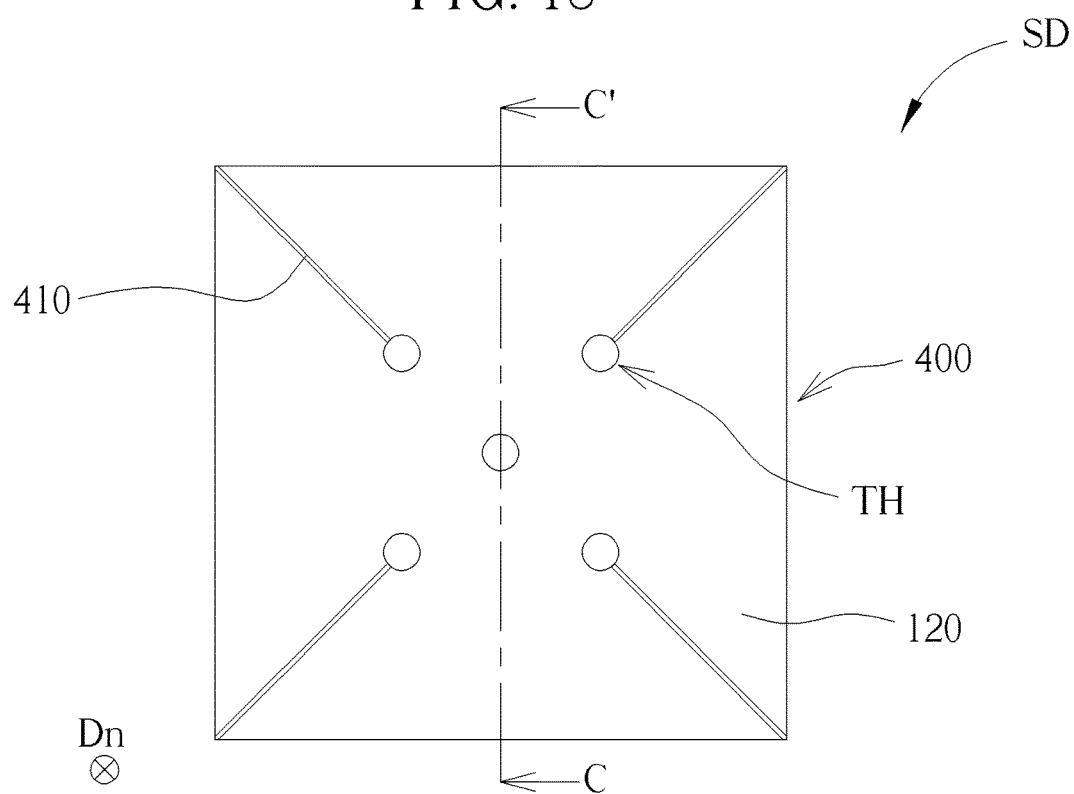
FIG. 19 is a schematic diagram of a top view illustrating an air pulse generating element of a sound producing device according to a fourth embodiment of the present invention.
Figure 20:
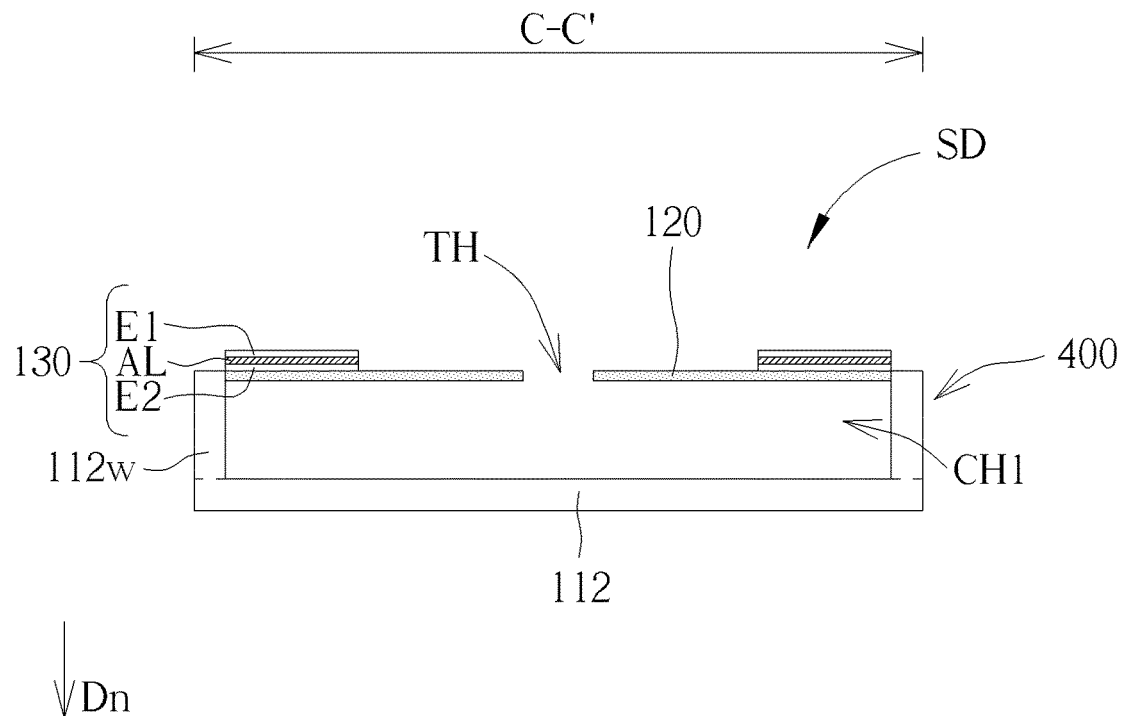
FIG. 20 is a schematic diagram of a cross sectional view of the same pulse generating element taken along a cross-sectional line C-C' of FIG. 19.

Referring to FIG. 19 and FIG. 20, FIG. 19 is a schematic diagram of a top view illustrating an air pulse generating element of a sound producing device according to a fourth embodiment of the present invention, and FIG. 20 is a schematic diagram of a cross sectional view of the same pulse generating element taken along a cross-sectional line C-C' of FIG. 19. As shown in FIG. 20, compared to the first and the second embodiments, while the first air chamber CH1 is still defined by the membrane 120, the first sidewall 112w and the first faceplate 112, the relative position between the membrane 120 and the first faceplate 112 has been swapped, and membrane 120 is now in the front, facing in the listener direction, while the first faceplate 112 is now the back faceplate, no longer the front as in FIG. 2. In addition, the membrane 120 has five through-holes TH, through which, air pulses will propagate toward the listener either directly or through a guiding conduit. Lastly, in FIG. 19, the membrane 120 further contains tension-relaxing features, such as at least one slit 410, to help reduce the (tensile) stress during the membrane actuation and increase the range of the membrane displacement. In some embodiments, the slits 410 may be connected to at least one of the through hole(s) TH to further reduce the stress and improve the range of membrane displacement. For instance, as shown in FIG. 19, each of the slits 410 may be connected to one of the through holes TH. In FIG. 19, each slit 410 connects diagonally to a corner of the membrane 120 of the air pulse generating element 400 to minimize stress during membrane actuation and increase the range of membrane displacement.

The width of slits 410 needs to be designed cautiously because they will cause airflow which leads to rapid dropping of the pressure difference Pd within the first air chamber CH1 and results in reduced output SPL. In this forth embodiment, since the membrane 120 is front facing, the slits 410 also connect the air within the first air chamber CH1 to the surrounding ambient of the sound producing device SD and perform functions similar to the through-holes TH in terms of generating and propagating acoustic waves. In this perspective, the width of the slit 410 should be treated in the same way the diameter of the through-hole TH is treated. In other words, same as the dimension of the through-hole TH, the width of the slit 410 should typically be a low multiple of the boundary layer thickness δ, corresponding to the shape and surface condition of the slits 410 in FIG. 19. For example, the width of the slit 410 may range from 0.5 μm to 5 μm. From another angle of view, the need for through-hole TH may be supplanted by a properly designed network of the slits 410, and this network of the slits 410 may function both as the means to relax the stress of membrane 120 during its deformation and as the means to connect the air within the first air chamber CH1 with the ambient outside and allow acoustic wave to be generated and transmitted. Accordingly, in the present invention, either the membrane 120 or the first faceplate 112 has at least one opening, and the opening may include the through hole TH or the slit 410.

In FIG. 19 and FIG. 20, although the membrane 120 has the openings, one of the openings (such as, the edge of the central through hole TH) may correspond to the maximum displacement position of the membrane 120 in the direction Dn, and/or the center of the smallest region containing all of the openings may correspond to the maximum displacement position of the membrane 120 in the top view. In some case, one of the openings (such as, the edge of the central through hole TH) or the center of the smallest region containing all of the openings may correspond to the region of the membrane 120 where its range of displacement in the direction Dn is greater than the threshold value.

There are innumerable variations and possible dispositions of the through holes TH and the slits 410, and they should be designed according to requirement for each specific application. The particular slit pattern and its relationship to the through-hole TH shown in FIG. 19 is for illustrative purpose only, and the present invention is not to be limited thereto.

Note that, in the sound producing device SD of FIG. 20, since the first faceplate 112, which faces away from sound radiating direction, is immobilizing when the air pulse generating element 400 of the sound producing device SD is operated to generate the air pulses, there is no backward radiating acoustic wave during the operation of the sound producing device SD and the need for an enclosure to contain the back radiating sound wave to prevent it from cancelling the front radiating sound wave, as in conventional speaker, is obsolete. In other words, the second air chamber CH2 (i.e., back enclosure) as depicted in FIG. 2 and FIG. 17 is not just optional, but irrelevant.

Figure 21:
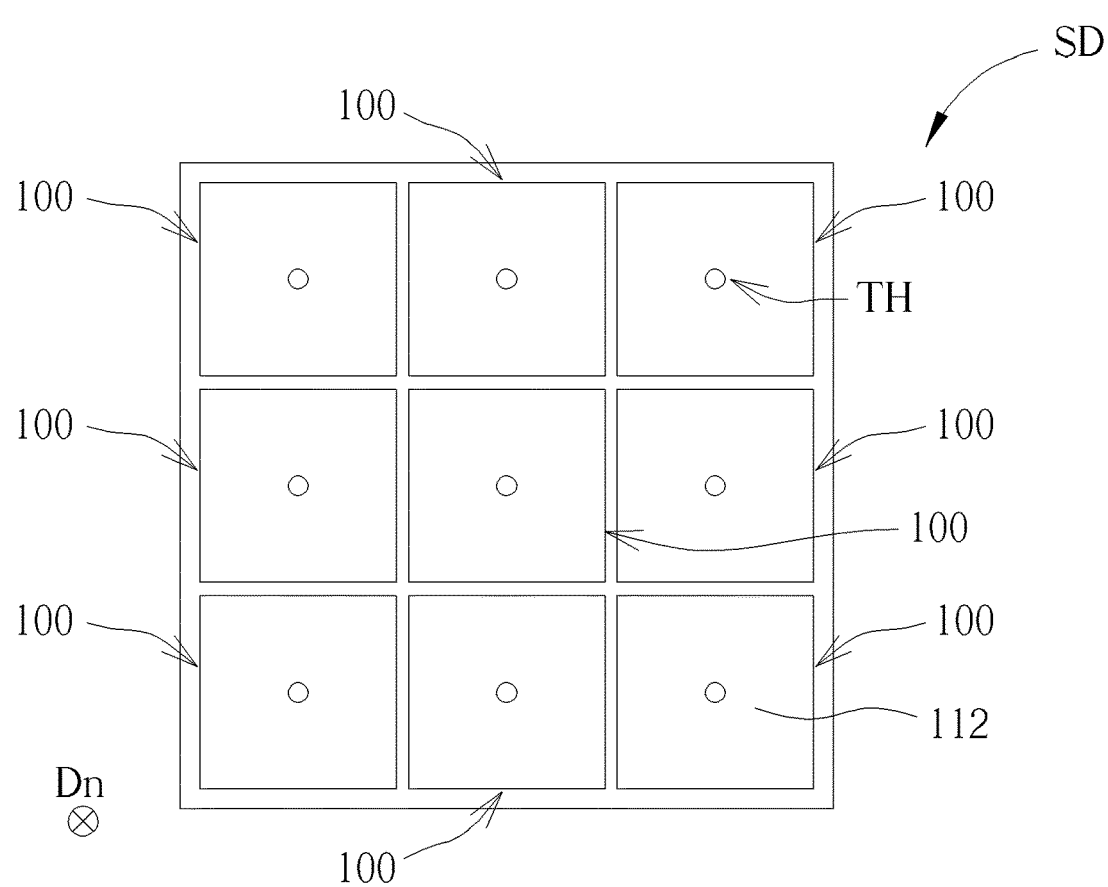
FIG. 21 is a schematic diagram of a top view illustrating a sound producing device according to an embodiment of the present invention.

Referring to FIG. 21, FIG. 21 is a schematic diagram of a top view illustrating a sound producing device according to an embodiment of the present invention. In the example of FIG. 21, the sound producing device SD includes a 3×3 array of air pulse generating elements, wherein each air pulse generating element may be the embodiment described or derived from the teaching of the present invention. For example, in FIG. 21, the sound producing device SD includes nine air pulse generating elements 100 to form the 3×3 array, but not limited thereto. In some embodiments, the air pulse generating elements included in the array may be the same or different based on requirement.

Figure 22:
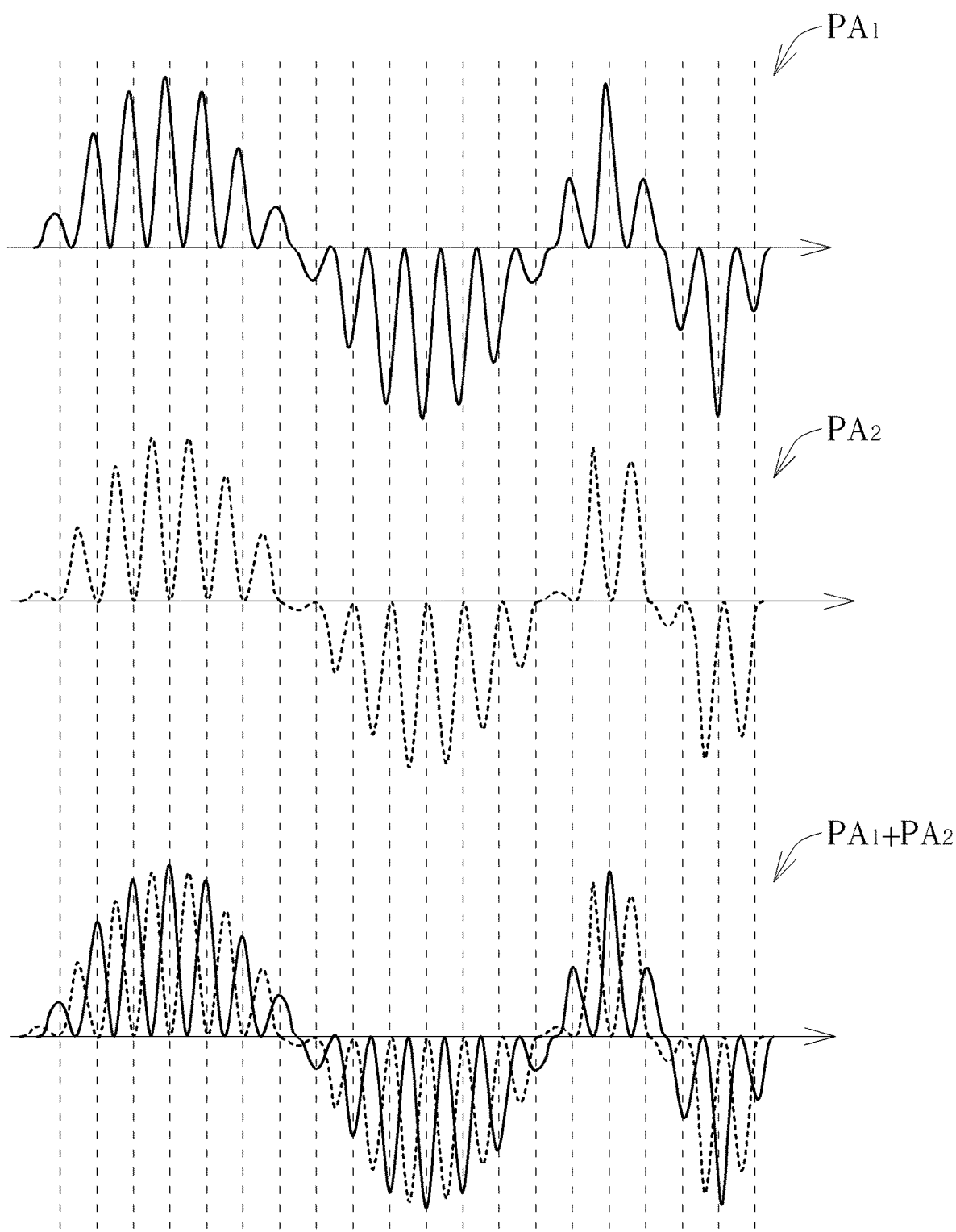
FIG. 22 is a schematic diagram illustrating waveforms of two arrays of the air pulses and a waveform of combining these arrays according to an embodiment of the present invention.

In particular, due to the plurality of air pulse generating elements included in the sound producing device SD, the overall air pulses may be generated by the air pulse generating elements in a temporally interleaved manner, and the acoustic wave SN corresponds to the combined effect produced by these overall air pulses. Regarding to the temporally interleaved manner, the air pulse generating elements are divided into a plurality of groups, the air pulses generated by different groups may be temporally interleaved, and these air pulses are combined to be the overall air pulses. For example, referring to FIG. 22, FIG. 22 shows a waveform of an array $PA_1$ of the air pulses generated by the group $A_1$ of the air pulse generating elements, a waveform of an array $PA_2$ of the air pulses generated by the group $A_2$ of the air pulse generating elements and a waveform of combining these two arrays $PA_1$ and $PA_2$. As shown in FIG. 22, the array $PA_1$ and the array $PA_2$ are temporally mutually interleaved, and each of the array $PA_1$ and the array $PA_2$ has a pulse rate $PR_G$. That is to say, one air pulse of the array $PA_1$ is aligned with a mid-point between two successive air pulses of the array $PA_2$. Thus, in FIG. 22, since the overall air pulses are combined by these two arrays $PA_1$ and $PA_2$, an overall pulse rate of the overall air pulses is $2 \cdot PR_G$. As the result, if the air pulse generating elements are divided into M groups, and the array of the air pulses generated by each group has the pulse rate $PR_G$, the overall pulse rate of the overall air pulses is $M \cdot PR_G$. Namely, the pulse rate of the array of the air pulses generated by one group (i.e., one or some air pulse generating element(s)) is less than the overall pulse rate of the overall air pulses generated by all group (i.e., all of the air pulse generating elements) if the number of the group is greater than 1.

In one embodiment, as shown of FIG. 21, by partitioning the 3×3 array into three groups, such as three rows of three air pulse generating elements, and controlling and driving these three groups of the air pulse generating elements in the temporally interleaved manner, the overall pulse rate (i.e., the pulse rate of the air pulses generated by all nine of the air pulse generating elements in FIG. 21) may be tripled, or alternatively, the pulse rate of the air pulses generated by each air pulse generating element may be lowered by 3 times to maintain the originally overall pulse rate.

For example, instead of mandating the air pulse generating elements to operate efficiently at the pulse rate of 72 kpps (kilo-pulse-per-second), the sound producing device SD illustrated in FIG. 21 may reduce the operation requirement of each air pulse generating element down to 24 kpps and maintain the effective pulse rate of 72 kpps, which may drastically simplify the designing, manufacturing and the cost of the resulting sound producing device SD.

In summary, the present invention provides the sound producing device SD capable of producing high fidelity sound, and the size of the sound producing device SD can be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A sound producing device, comprising:
    at least one air pulse generating element, each of the at least one air pulse generating element comprising:
        a membrane;
        a first air chamber, wherein a chamber pressure exists in the first air chamber; and
        at least one opening;
        wherein the membrane is actuated to change the chamber pressure of the first air chamber to generate a plurality of air pulses, the plurality of air pulses are propagated through the at least one opening, the plurality of air pulses produce a non-zero offset in terms of sound pressure level, and the non-zero offset is a deviation from a pressure value of an ambient pressure outside the sound producing device,
        wherein each of the plurality of air pulses has a pulse cycle of a plurality of pulse cycles, each of the pulse cycles has a pulse-generating time segment and a pulse-isolating time segment in sequence, a driving signal is applied to actuating the membrane in one of the pulse cycles, and the driving signal during the pulse-generating time segment is different from the driving signal during the pulse-isolating time segment.

2. The sound producing device of claim 1, wherein the pulse-generating time segment comprises a rising period and a maintaining period in sequence, the driving signal comprises a first part corresponding to the rising period and a second part corresponding to the maintaining period, and a voltage level of the first part is the same as a voltage level of the second part.

3. The sound producing device of claim 1, wherein the driving signal rises toward a peak driving voltage during the pulse-generating time segment.

4. The sound producing device of claim 1, wherein the driving signal has a sloped waveform during the pulse-generating time segment.

5. The sound producing device of claim 1, wherein the driving signal has a curved waveform during the pulse-generating time segment.

6. The sound producing device of claim 1, wherein the pulse-generating time segment comprises a rising period, the pulse-isolating time segment comprises a falling period, the driving signal comprises a first part corresponding to the rising period and a third part corresponding to the falling period, and a voltage level of the third part is different from a voltage level of the first part.

7. The sound producing device of claim 6, wherein the voltage level of the third part has a slope.

8. The sound producing device of claim 6, wherein the voltage level of the third part has a curve.

9. The sound producing device of claim 6, wherein the pulse-isolating time segment further comprises an isolation period after the falling period, the driving signal further comprises a fourth part corresponding to the isolation period, and a voltage level of the fourth part is different from the voltage level of the first part.

10. The sound producing device of claim 9, wherein the voltage level of the third part is the same as the voltage level of the fourth part.

11. The sound producing device of claim 1, wherein the driving signal during the pulse-generating time segment is scaled based on a sampled value of an input signal.

12. The sound producing device of claim 1, wherein the driving signal during the pulse-generating time segment is scaled based on a difference between two successively sampled values of an input signal.

13. The sound producing device of claim 1, wherein in a previous pulse cycle and a present pulse cycle among the pulse cycles, the previous pulse cycle and the present pulse cycle are successive and in sequence, and an ending voltage level of driving signal in the previous pulse cycle is the same as an ending voltage level of driving signal in the present pulse cycle.

14. The sound producing device of claim 1, wherein in one of the pulse cycles, during the pulse-generating time segment, a value of the chamber pressure of the first air chamber is different from the pressure value of the ambient pressure outside the sound producing device.

15. The sound producing device of claim 2, wherein a value of the chamber pressure at an end of the rising period is defined as a first pressure value, a value of the chamber pressure at an end of the maintaining period is defined as a second pressure value, and the first pressure value is different from the second pressure value.

16. The sound producing device of claim 15, wherein the second pressure value is between the first pressure value and the pressure value of the ambient pressure outside the sound producing device.

17. The sound producing device of claim 15, wherein a ratio of a difference between the first pressure value and the second pressure value to the first pressure value is less than $1/10$.

18. The sound producing device of claim 1, wherein a first rapid pressure change occurs in the first air chamber in a beginning of the pulse-generating time segment, a second rapid pressure change occurs in the first air chamber in a beginning of the pulse-isolating time segment, and an absolute value of an instantaneous changing rate of the first rapid pressure change and an absolute value of an instantaneous changing rate of the second rapid pressure change are greater than 100 Pa/μs.

19. The sound producing device of claim 18, wherein in one of the pulse cycles, after the second rapid pressure change occurs, a value of the chamber pressure of the first air chamber changes to be close to the pressure value of the ambient pressure outside the sound producing device.

20. The sound producing device of claim 18, wherein in one of the pulse cycles, the pulse-generating time segment comprises a rising period, the pulse-isolating time segment comprises a falling period, the first rapid pressure change occurs in the rising period, and the second rapid pressure change occurs in the falling period.

21. The sound producing device of claim 1, wherein a length of the pulse-isolating time segment is longer than a length of the pulse-generating time segment.

22. The sound producing device of claim 21, wherein the length of the pulse-isolating time segment is 2 times to 4 times the length of the pulse-generating time segment.

23. The sound producing device of claim 1, wherein a length of the pulse-generating time segment is longer than a length of the pulse-isolating time segment.

* * * * *